(12) United States Patent
Satoh et al.

(10) Patent No.: US 6,714,447 B2
(45) Date of Patent: Mar. 30, 2004

(54) SEMICONDUCTOR DEVICE AND A INTEGRATED CIRCUIT CARD

(75) Inventors: Akihiko Satoh, Hachioji (JP); Masahito Takahashi, Tachikawa (JP)

(73) Assignee: Renesas Technology Corporation, Tokyo (JP)

( * ) Notice: Subject to any disclaimer, the term of this patent is extended or adjusted under 35 U.S.C. 154(b) by 0 days.

(21) Appl. No.: 10/085,037

(22) Filed: Mar. 1, 2002

(65) Prior Publication Data

US 2002/0141240 A1 Oct. 3, 2002

(30) Foreign Application Priority Data

Mar. 30, 2001 (JP) .......................................... 2001-099325

(51) Int. Cl.$^7$ .............................................. G11C 16/04
(52) U.S. Cl. ............................. 365/185.02; 365/185.17; 365/185.28
(58) Field of Search .................... 365/185.02, 185.17, 365/185.25, 185.28

(56) References Cited

U.S. PATENT DOCUMENTS

| | | | |
|---|---|---|---|
| 4,542,485 A | * | 9/1985 | Iwahashi et al. ........ 365/189.09 |
| 4,897,815 A | * | 1/1990 | Tanaka et al. .......... 365/185.11 |
| 6,046,936 A | | 4/2000 | Tsujikawa et al. ...... 365/185.03 |

FOREIGN PATENT DOCUMENTS

JP   10-275484   10/1998   .......... G11C/16/02

OTHER PUBLICATIONS

Patent Abstracts of Japan 10275484 Oct. 13, 1998.

* cited by examiner

*Primary Examiner*—Vu A. Le
(74) *Attorney, Agent, or Firm*—Antonelli, Terry Stout & Kraus, LLP

(57) ABSTRACT

It is possible to suppress or prevent so-called write disturbance phenomenon from occurring in write-disabled non-selected memory cells in a semiconductor device, in any selected one of which data can be written electrically by means of the so-called tunneling phenomenon. In a flash memory that can disable writing of data by suppressing injection of electrons in the accumulation layer of each non-selected memory cell in which data is to be written with a writing disable voltage applied to the drain thereof before a write voltage is applied to the control gate electrode of each selected memory cell, the relationship among a writing disable voltage Vwd, a read voltage Vr applied to the drain of a selected memory cell from which data is to be read, and a punch-through withstand voltage BVds between the source and the drain of each selected memory cell is set to satisfy Vr<BVds<Vwd.

27 Claims, 22 Drawing Sheets

Vr : READ VOLTAGE
BVds : PUNCH-THROUGH WITHSTAND VOLTAGE
Vwd : WRITING DISABLE
BVdj : DRAIN-WELL JUNCTION BREAKDOWN VOLTAGE

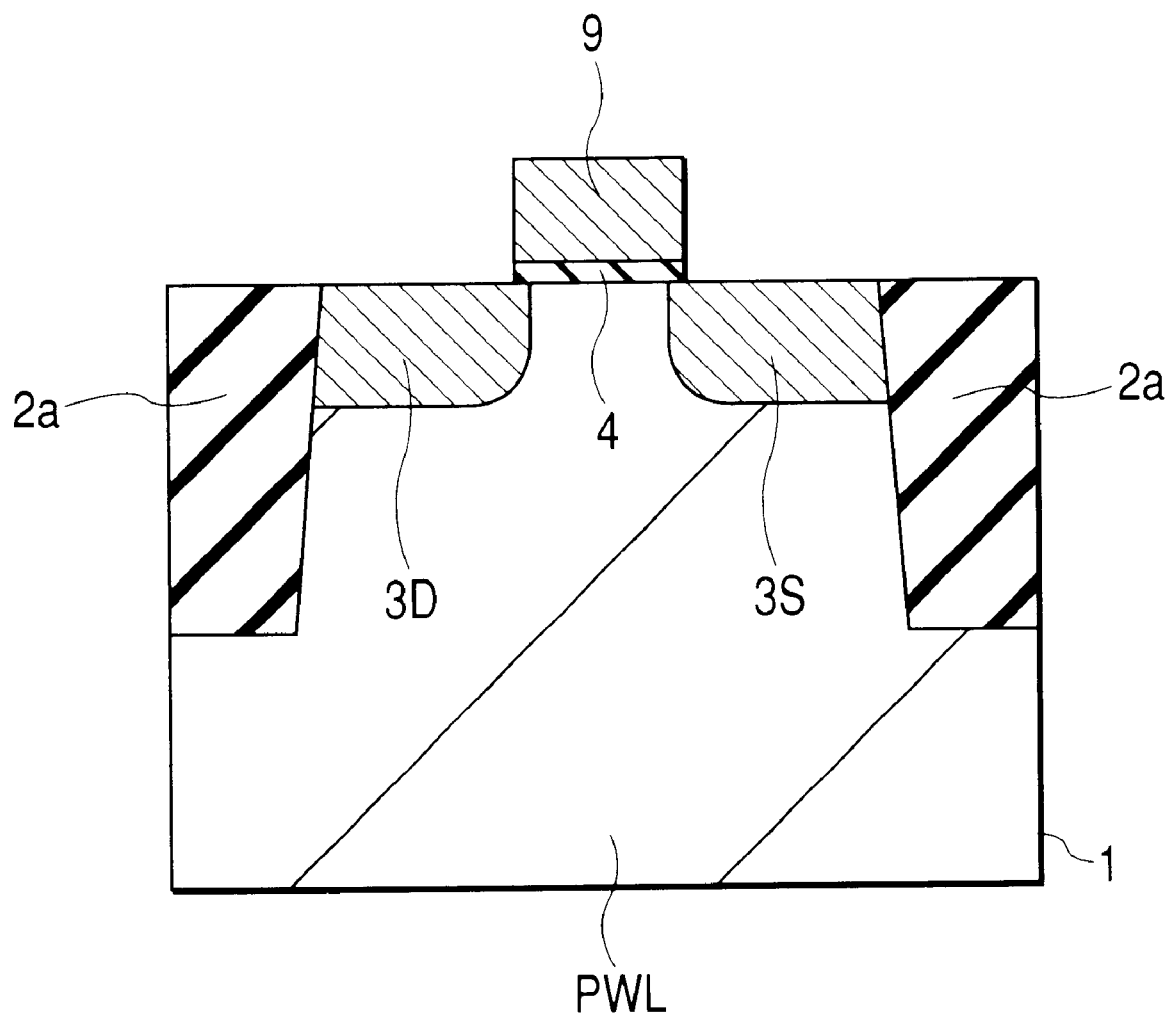

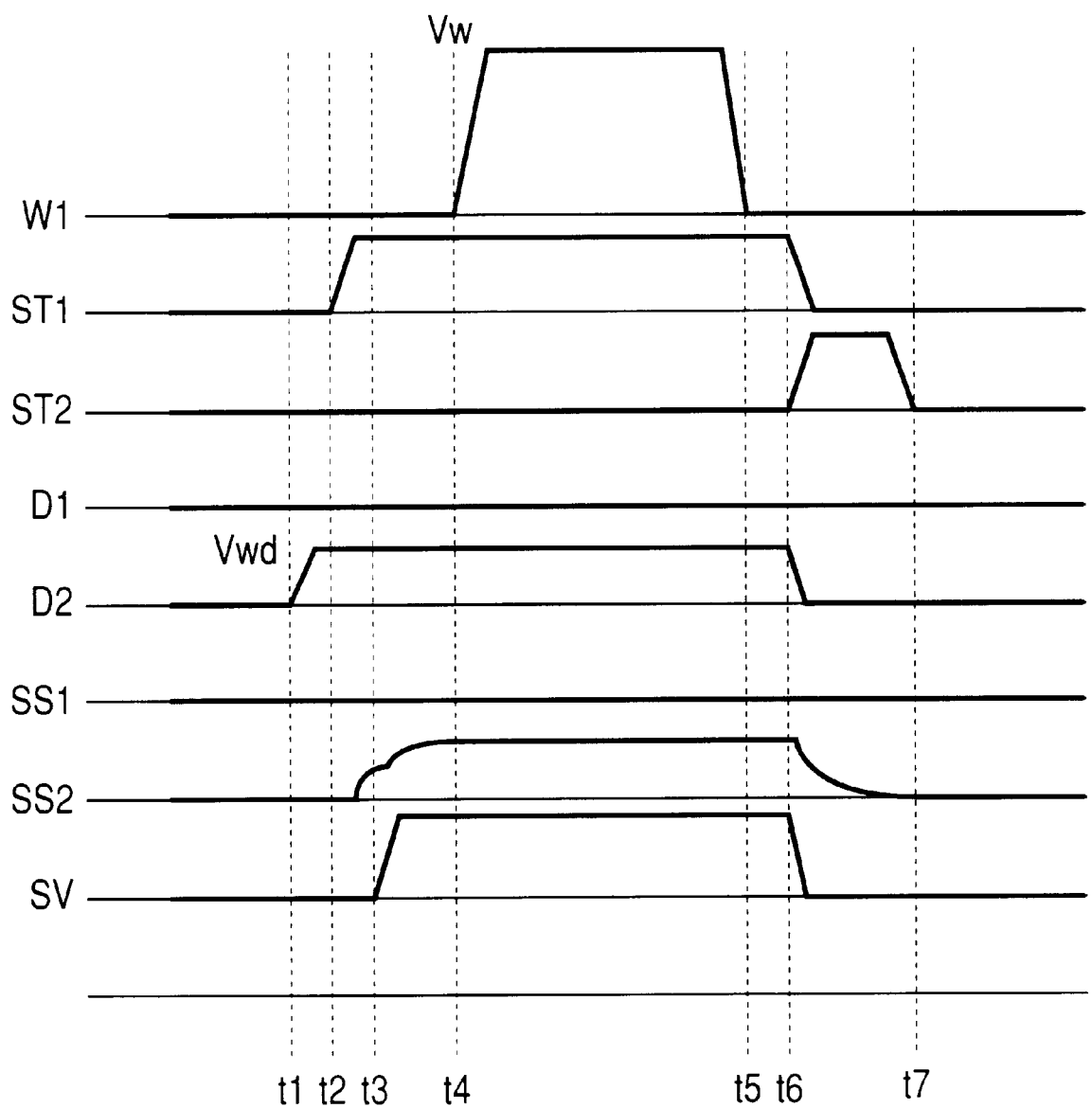

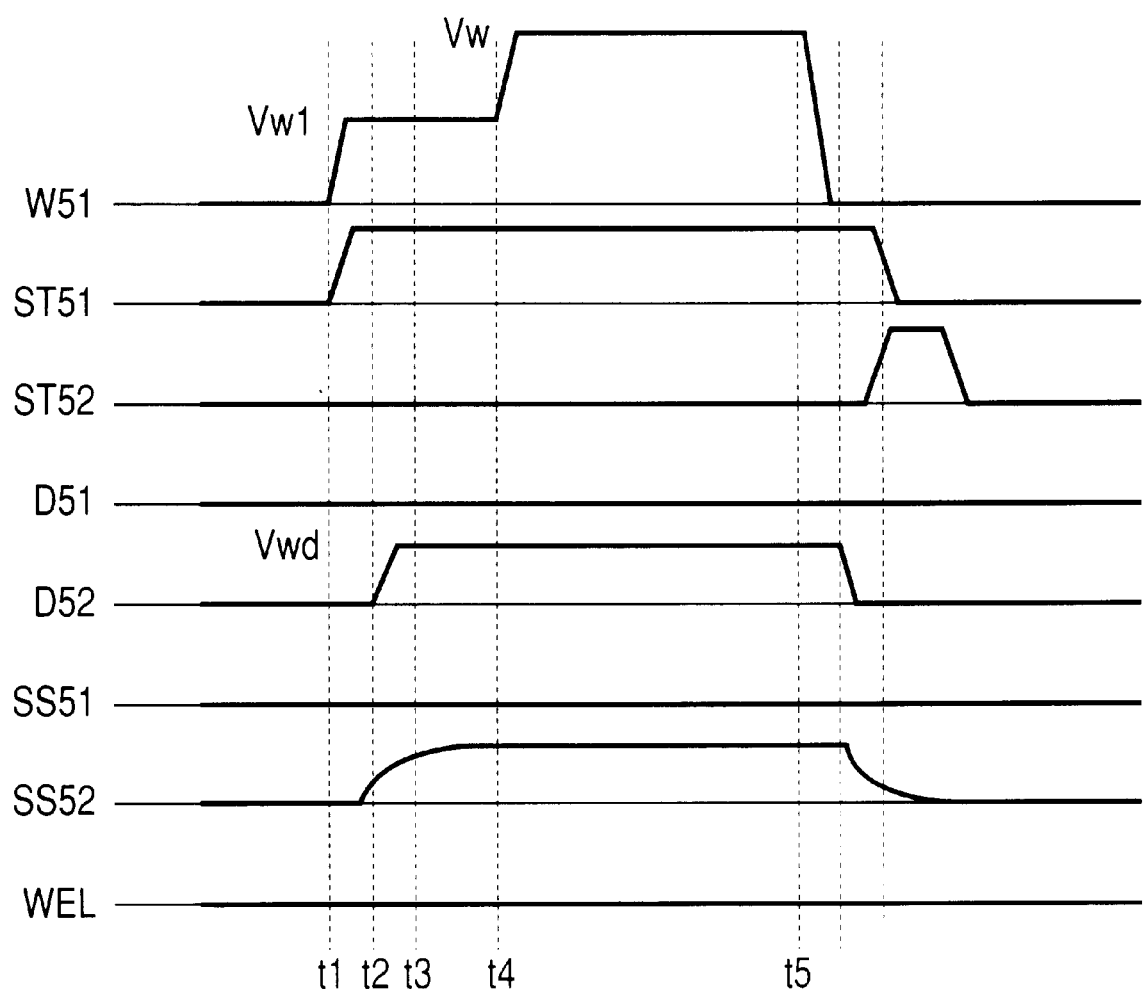

SEMICONDUCTOR DEVICE AND A INTEGRATED CIRCUIT CARD

TECHNICAL FIELD

The present invention relates to the techniques of semiconductor devices and integrated circuit cards. More particularly, the present invention relates to the techniques employable effectively for semiconductor devices and integrated circuit cards provided with flash memories (EEPROM: Electric Erasable Programmable Read Only Memory) respectively.

BACKGROUND OF THE INVENTION

The flash memory (EEPROM) examined by the present inventor et al employs a method that sets the potential of a data line connected to a selected memory cell to a ground potential, then applies a positive high voltage (write voltage) to the word line (the control gate electrode of the selected memory cell) connected to the selected memory cell, thereby generating an FN (Fowler-Nordheim) tunneling phenomenon so as to inject electrons in the floating gate electrode of the selected memory cell.

According to the method, however, because the control gate electrodes of other non-selected memory cells are also connected electrically to the word line to which the control gate electrode of the selected memory cell is connected electrically, the write voltage is applied to the control gate electrodes of the non-selected memory cells. As a result, a write errors occur sometimes in those non-selected memory cells. To prevent such write errors, therefore, writing of data in those non-selected memory cells must be disabled.

SUMMARY OF THE INVENTION

This write disable operation is executed as follows, for example. Prior to the application of the write voltage to a selected word line so as to write data in a selected memory cell, a writing disable voltage of about 6V is applied to the drains (that is, the data line) of the non-selected memory cells, thereby charging the writing disable voltage to the selected sub-source line. The channel potential of each non-selected memory cell then rises up to the potential of the writing disable voltage when the writing disable voltage is applied to the word line for the data writing. The gate electric field of each non-selected memory cell is thus eased and injection of electrons in the floating gate electrode thereof can be suppressed.

Such a flash memory is disclosed by, for example, U.S. Pat. No. 6,046,936 corresponding to the official gazette of Japanese Patent Application Laid-Open No. Hei 11 (1999)-232886 or Japanese Patent Application Laid-Open No. Hei 10 (1998)-275484. The flash memory (EEPROM) is an AND one that makes good use of the tunneling phenomenon for writing/erasing data therein/therefrom.

The present inventor et al have found for the first time that hot electrons are generated in non-selected memory cells in such a write disable operation, since a transient channel current used to charge the selected sub-source line flows in each non-selected memory cell for a moment while a positive voltage is applied to both control electrode and drain thereof. When such hot electrons are affected by the gate electric field, thereby being injected in the floating gate of a non-selected memory cell, the threshold voltage of the non-selected memory cell rises, causing wrong writing, that is, a so-called write disturbance phenomenon. In other words, data is written in the non-selected memory cell due to a mechanism completely different from the tunneling phenomenon.

Especially, when memory cells are reduced in size for higher integration, the electric field at the end of the drain of each of those memory cells becomes stronger. This makes it easier to generate such hot electrons. As a result, the write disturbance phenomenon as described above comes to occur more frequently. For a flash memory (EEPROM) in which writing and erasing of data can be repeated, a problem arises due to such repetitive operations while no problem arises from occurrence of one or a few times of write disturbance.

Under such circumstances, it is an object of the present invention to provide a technique that can suppress or prevent such a write disturbance phenomenon from occurring in each write-disabled non-selected memory cell in a semiconductor device provided with a plurality of non-volatile memory cells, in each selected one of which data can be written electrically through the tunneling phenomenon.

Those and other objects, as well as new features of the present invention will become more apparent from the description of this specification and the accompanying drawings.

Hereinafter, the representative items of the present invention disclosed in this specification will be described briefly.

Concretely, the semiconductor device of the present invention provided with a plurality of non-volatile memory cells, in each selected one of which data can be written electrically through the tunneling phenomenon is structured so as to generate a punch-through phenomenon between the source and the drain of each non-selected memory cell when a writing disable voltage is applied to the drain thereof.

BRIEF DESCRIPTION OF THE DRAWINGS

FIG. 7 is an explanatory cross sectional view of the major part of a short-circuiting MIS.FET in the flash memory (EEPROM) shown in FIG. 6;

FIG. 8 is a timing flowchart of data writing in one memory cell shown in FIG. 6;

FIG. 24 is a timing flowchart of data writing in the flash memory (EEPROM) shown in FIG. 23.

DETAILED DESCRIPTION OF THE PREFERRED EMBODIMENTS

Although the present invention will be described dividedly in a plurality of sections or embodiments as needed for convenience's sake, those sections or embodiments are related to each another unless otherwise described apparently; one section or embodiment is related to the modification, details, supplemental description, etc. of part or whole of other sections or embodiments.

In the embodiments to be described below, the number of elements (including the number of articles, values, amounts, ranges, etc.) is not limited to any specific number unless otherwise specified apparently and not limited only to a specific number of elements in principle unless otherwise described specially; it may be over or under a specific number of elements.

Furthermore, in the following embodiments, the elements (including element steps, etc.) are not always indispensable unless otherwise described apparently and considered to be indispensable in principle.

In the same way, in the following embodiments, shapes, positions, etc. of those elements to be mentioned below include those approximate or similar to the actual shapes, etc. unless otherwise specially described apparently and considered not to be so in principle. This is also true for the values and ranges described above.

In addition, the same numerals will be given to the elements having the same functions in all the accompanying drawings for describing the embodiments of the present invention to avoid redundant description.

Furthermore, in the embodiments of the present invention, some of the accompanying drawings other than the cross sectional ones will be hatched so as to make it easier to look at them.

In the embodiments of the present invention, the MIS-.FET (Metal Insulator Semiconductor Field Effect Transistor) that represents field effect transistors will be abbreviated as MIS and n-channel MIS/FET will be abbreviated as nMIS.

Hereunder, the preferred embodiments of the present invention will be described in detail with reference to the accompanying drawings.

First Embodiment

At first, a description will be made for a configuration of the flash memory (EEPROM) examined by the present inventor et al, as well as data writing in the flash memory and the conventional technical problems that will arise from the data writing.

Figure 23:
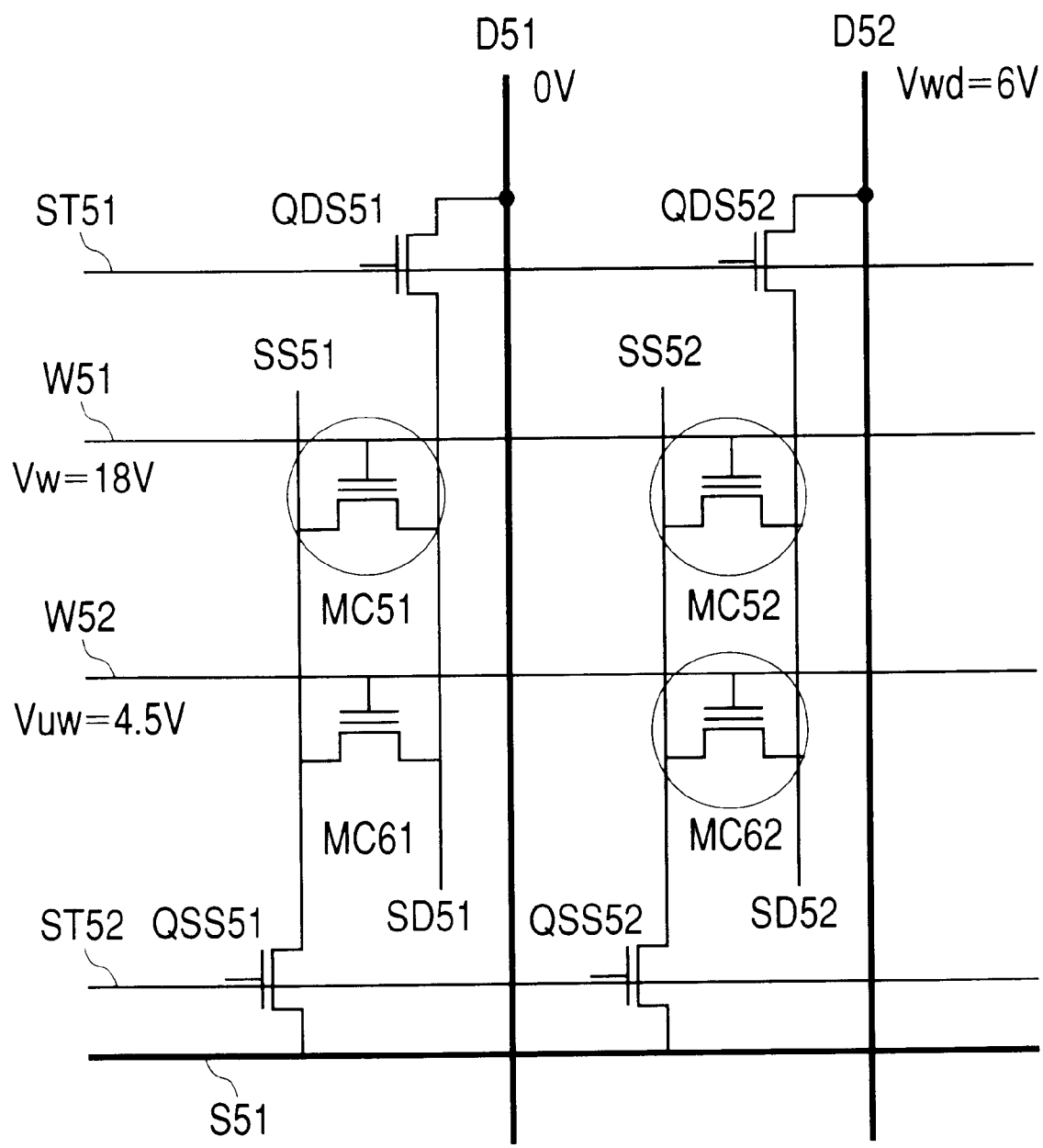
FIG. 23 is a partial circuit diagram of the flash memory examined by the present inventor et al.

The flash memory (EEPROM) examined by the present invention et al is, for example, an AND type flash memory (EEPROM). FIG. 23 shows a circuit diagram of the major part of the flash memory. FIG. 24 shows a timing flowchart of the data writing in the flash memory. FIG. 25 shows a cross sectional view of the major part of a semiconductor substrate for describing a write disturbance phenomenon that might occur in a non-selected memory cell in the data writing.

The data lines of the flash memory (EEPROM) are divided into main data lines D51 and D52, as well as sub-date lines SD51 and SD52 hierarchically. The source lines of the flash memory (EEPROM) are also divided into main source line S51, as well as sub-source lines SS51 and SS52 hierarchically. The main data lines D51 and D52, as well as the main source line S51 made of a metallic material respectively are disposed in a wiring layer. The sub-date lines SD51 and SD52, as well as the sub-source lines SS51 and SS52 are disposed in a semiconductor region formed on the semiconductor substrate. The main data lines D51 and D52 are connected to the sub-data lines SD51 and SD52 electrically via selective MISQDS51 and MISQDS52. The gate electrodes of the selective MISQDS51 and MISQDS52 are connected to a signal line ST51 electrically. The main source line S51 is also connected to the sub-source lines SS51 and SS52 via the selective MISQDS51 and MIS-QDS52. The gate electrodes of the selective MISQSS51 and MISQSS52 are connected to a signal line ST52 electrically. And, a plurality of memory cells MC51 and MC61 are connected to each other in parallel between the sub-data line SD51 and the sub-source line SS51. In other words, the drains and the sources of the memory cells MC 51 and MC61 are connected to each of the sub-data line SD51 and the sub-source line SS51 electrically. And, a plurality of memory cells MC52 and MC62 are connected to each other in parallel between the sub-data line SD52 and the sub-source line SS52. In other words, the drains and the sources of the memory cells MC52 and MC62 are connected to each of the sub-data line SD52 and the sub-source line SS62 electrically. The control gate electrodes of the memory cells MC51 and MC52 that are adjacent in the same row are connected to the same word line W51 electrically. The control gate electrodes of the memory cells MC61 and MC62 that are adjacent in the same row are connected to the same word line W52 electrically.

Each of the memory cells MC51, MC52, MC61, and MC62 has a structure of a two-layer gate electrode in which two gate electrodes (a floating gate electrode 51 and a control gate electrode 52) are formed on the semiconductor substrate 50 as shown in FIG. 25. Data can thus be written in each memory cell by electrons injected in the floating gate electrode 51 through the tunneling phenomenon. Each dotted line in FIG. 25 denotes an extension of the barrier layer of the memory cell.

Next, a description will be made for how writing of data is disabled in a non-selected memory cell in such a flash memory (EEPROM) described above. It is premised here that the memory cell MC51 is a selected memory cell MC51 and the memory cell MC52 is a non-selected memory cell MC52 in which writing is disabled. The memory cells MC51 and MC52 are connected to the same word line W51 electrically.

Figure 25A:
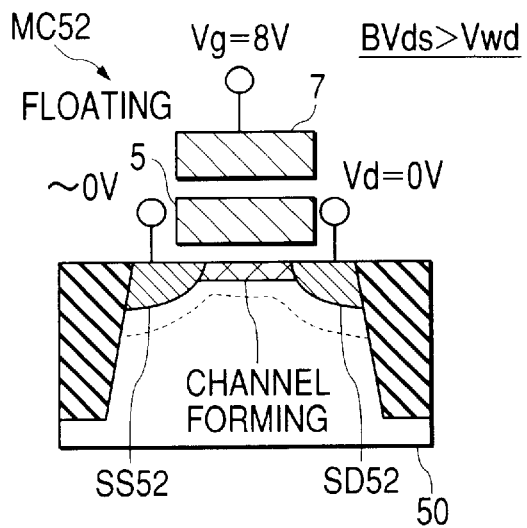
FIGS. 25A to C are partial cross sectional views of a semiconductor substrate for describing how a write disturbance phenomenon occurs in a non-selected memory cell in the flash memory (EEPROM) shown in FIG. 23.
Figure 25B:
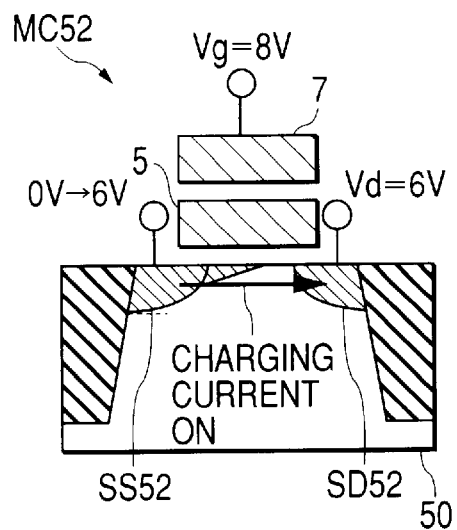

At first, the voltage of the word line W51 is raised to the first voltage Vw1, which is, for example, about 8V (at the time t1 in FIG. 24). This first voltage Vw1 is sufficient to turn on the memory cells MC51 and MC52 connected to the word line W51 and to charge the writing disable voltage (to be described later) in the sub-source line SD52. At this time, the voltage of the signal line ST52 is set at 0V to turn off the selective MISQSS51 and set each of the sub-source lines SS51 and SS52 in the floating state. On the other hand, a predetermined voltage is applied to the signal line ST51 to turn on the selected MISQSD51, then a ground voltage of, for example, 0V is applied to the sub-date lines. SD51 and SD52 from the main data lines D51 and D52. Consequently, as shown in FIG. 25A, a channel is formed on the surface of the semiconductor substrate 50, on which both selected memory cell MC51 and non-selected memory cell MC52 are disposed. After this, a writing disable voltage of, for example, 6V is applied to the main data line D52 connected to the non-selected memory cell MC52 so that the potential of the line D52 becomes 6V. At this time, the potential of the main data line D51 connected to the selected memory cell MC51 is kept at 0V (at the time t2 in FIG. 24). Consequently, the writing disable voltage is applied to the drain of the non-selected memory cell MC52 via the selected sub-data line and this voltage is transferred to the sub-source line SS51 via the non-selected memory cell MC52, thereby the sub-source line SS52 is charged (at during the time t2 to t3 in FIG. 24). At this time, as shown in FIG. 25B, a transient channel current (charging current) flows in the boundary with the tunnel insulator in the surface layer of the semiconductor substrate 50 for a moment. The channel current charges the sub-source line SS52.

Figure 25C:
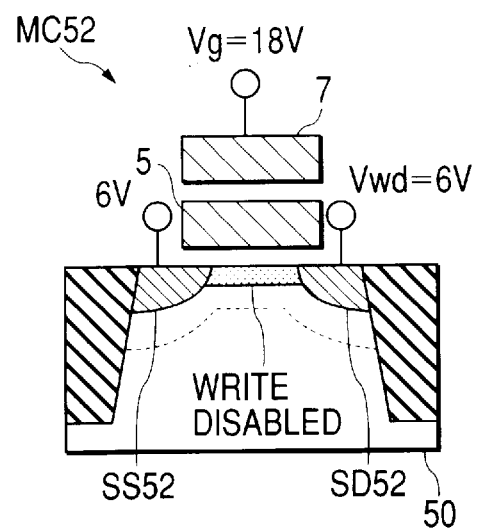

After charging of the sub-source lines SS51 and SS52 of the selected memory cell MC51 and the non-selected memory cell MC52 is completed, the write voltage of the word line W51 is raised to, for example, about 18V (during the time t4 to t5 in FIG. 24). At this time, electrons are injected in the floating gate electrode of the selected memory cell MC51 from all over the channel surface (ground potential) formed on the surface of the semiconductor substrate 50, thereby data is written in the MC51. On the other hand, in the non-selected memory cell MC52, because the writing disable voltage is applied to its drain (that is, the sub-data line SD52) and the sub-source line SS52, the channel potential of the MC52 is also raised to this writing disable voltage, thereby the gate electric field is eased. As a result, as shown in FIG. 25C, injection of electrons into its floating gate can be suppressed. This is why no data is written (write disable) in the non-selected memory cell MC52.

As a result of the examination by the present inventor et al, however, it has been found for the first time that a transient channel current that charges the sub-source line SS52 flows in the non-selected memory cell MC52 for a moment while a positive voltage is applied to both control gate electrode and drain of the MC52 (especially while a high voltage of about 6V is applied to the drain), thereby hot electrons are generated in some cases. In the case where such hot electrons, affected by the gate electric field, are injected into the floating gate electrode of the MC52, the write disturbance phenomenon as described above occurs. In other words, such injected hot electrons cause a write error to occur in the non-selected memory cell MC52.

Such a problem comes to arise more remarkably as memory cells are reduced in size. This is mainly because the electric field between the source and the drain of each selected memory cell becomes stronger due to the impurity density in the semiconductor substrate (well) increased to suppress the falling of the threshold voltage therein, which is caused by the reduction of both gate and channel in length in accordance with such reduction of the memory size.

The above problem also arises more remarkably due to an increase of respective writing/erasing operations. In other words even though electron injection just once or several times in a hot electron phenomenon is not problematic, as writing/erasing of data is repeated, injection of electrons is also repeated in the same memory cell due to the above-described hot electron action while writing/erasing of data is repeated a number of times, thereby the amount of injected electrons in the memory cell increases and a write disturbance phenomenon occurs, causing the data to be changed abruptly therein while no problem arises with one or a few times of the hot electron action.

Figure 1:
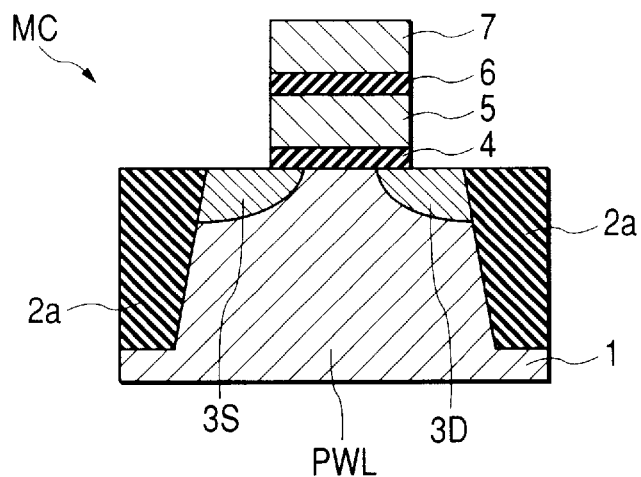
FIG. 1 is an explanatory cross sectional view of the major part of a memory cell of a flash memory (EEPROM) which is an embodiment of the present invention.

Such a problem is prevented as follows in this embodiment. FIG. 1 shows an explanatory cross sectional view of a memory cell MC in an AND type flash memory (EEPROM), which is an embodiment of the present invention.

A semiconductor substrate 1 (hereinafter, to be referred to as the substrate) of a semiconductor chip (hereinafter, to be referred to as the chip) is formed with, for example, p-type single crystal silicon (Si) and each p-well PWL is formed at a predetermined depth from the main surface of the substrate 1. The p-well PWL contains, for example, boron. In an isolated region on the main surface (element forming side) of the substrate 1 is formed, for example, a shallow groove isolation (SGI) 2a. This shallow groove isolation 2a is formed by embedding, for example, silicon oxide ($SiO_x$) in a groove formed at a predetermined depth from the main surface of the substrate 1. The isolation 2a is not limited only to such a groove one; for example, it may be formed by the LOC (Local Oxidization of Silicon) method.

A memory cell MC is disposed in an active region enclosed by the isolation 2a on the main surface of this substrate 1. The memory cell MC includes a pair of n-type semiconductor regions 3D and 3S, a gate. insulator 4 formed on the main surface of a p-well PWL between the pair of semiconductor regions 3D and 3S, as well as a floating gate electrode 5, an insulator 6 between gate electrodes (hereinafter, to be referred to as the interlaminar layer), and a control gate electrode 7 that are laminated sequentially on the insulator 4.

The n-type semiconductor regions 3S and 3D are used to form a source and a drain of each memory cell respectively. The source forming n-type semiconductor region 3S is formed with part of a sub-source line (to be described later) and the drain forming n-type semiconductor region 3D is formed with part of a sub-data line (to be described later) respectively. The gate insulator 4 functions as a region for passing electrons (tunnel insulator) injected in the floating gate electrode 5 from the substrate 1 so as to form data and discharge the electrons from this floating gate electrode 5 to the substrate 1 to erase the data. The floating gate electrode 5 holds the electrons and it is kept in the floating state. The control gate electrode 7 controls writing, erasing, and reading of data. It is formed with part of a word line (to be described later).

Figure 2:
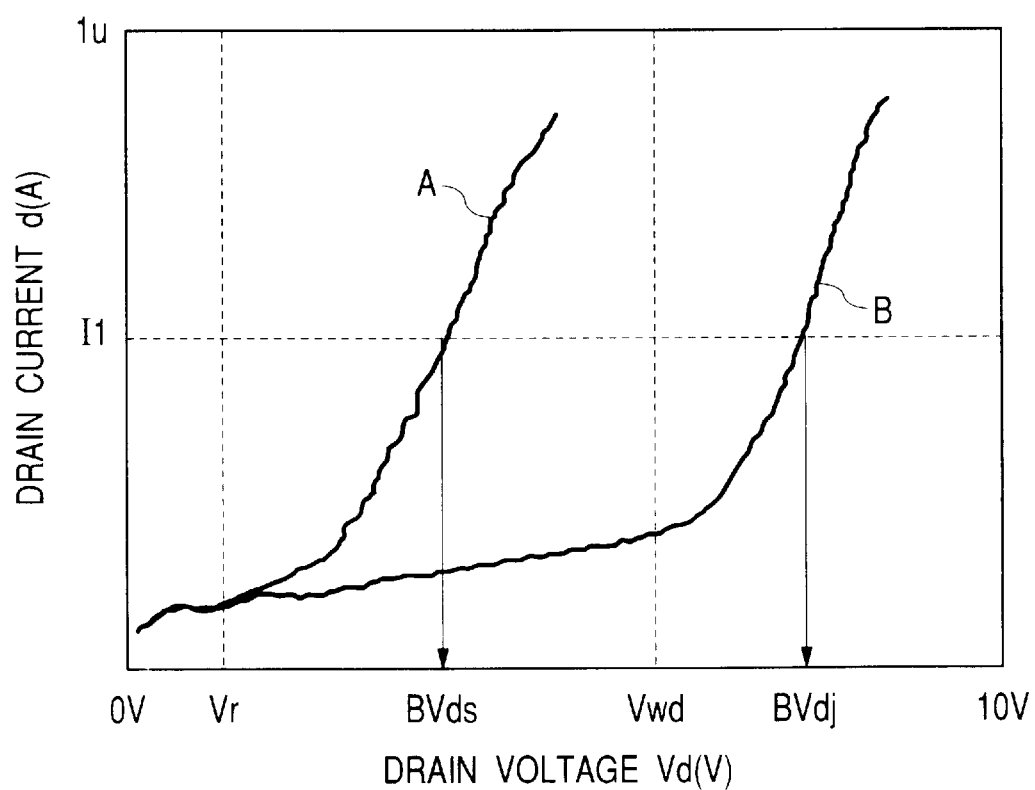
FIG. 2 is a graph for denoting the electrical characteristics of each type junction of the memory cell shown in FIG. 1.

FIG. 2 shows a chart for describing the electrical characteristics of the drain junction of a memory cell MC shown in FIG. 1 with respect to each operation voltage. In FIG. 2, a curve A denotes a source-drain punch-through current and a curve B denotes a substrate-drain junction current respectively.

In this embodiment, the impurity density distribution is controlled properly in the above p-well PWL, the source forming n-type semiconductor region 3S, and the drain forming semiconductor region 3D respectively, thereby the source-drain punch-through withstand voltage BVds and the drain-well junction breakdown voltage BVdj are set so as to satisfy the relationship represented as shown in the following formula with respect to both read drain voltage Vr and writing disable voltage Vwd.

$$V < BVds < Vwd < BVdj$$

In this case, the punch-through withstand voltage BVds and the drain-well junction breakdown voltage BVdj take voltage values to be assumed when the punch-through current and the well-drain junction current becomes a predetermined standard value I1 respectively. The standard current I1 is decided by the power supply capacity enough to supply, for example, the writing disable voltage Vwd, as well as the allowable value of the current consumption at the above well-drain junction.

Figure 3:
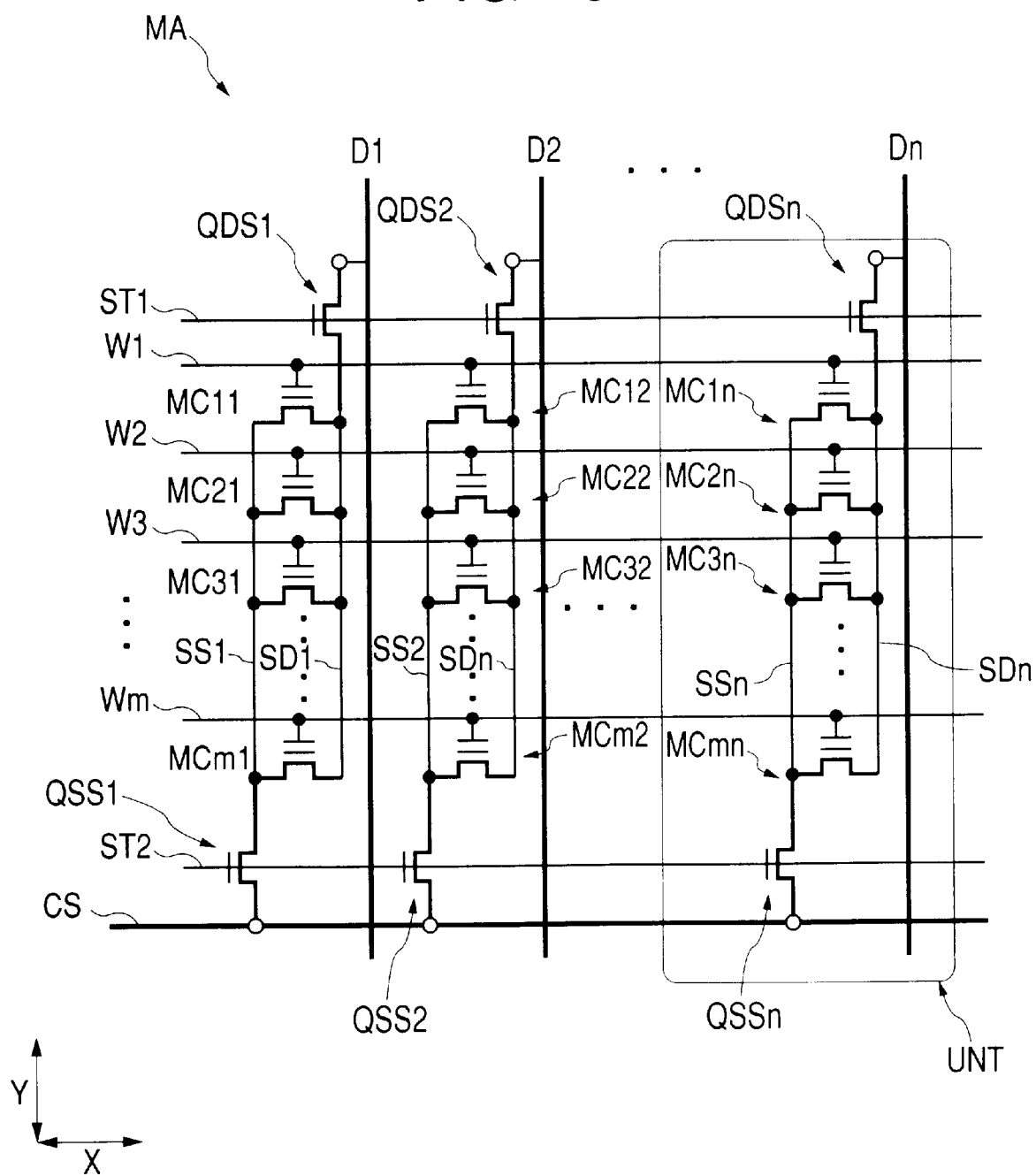
FIG. 3 is a circuit diagram of a memory array in the flash memory (EEPROM), which is an embodiment of the present invention.

FIG. 3 shows a circuit diagram of a memory array MA in the AND type flash memory (EEPROM) in this embodiment.

In the memory array MA, a plurality of main data lines D1 to Dn extended in the vertical (Y) direction in FIG. 3 are disposed side by side in the horizontal (X) direction in FIG. 3. These main data lines D1 to Dn are metallic lines formed in wiring layers and they can be connected/disconnected to/from sub-data lines SD1 to SDn via selective MISQDS1 to MISQDSn. In other words, the data lines are divided into main and sub-hierarchical layers. The sub-data lines SD1 to SDn are formed in an n-type semiconductor region (the above drain forming semiconductor region 3D) formed on the substrate 1 and extended in the vertical (Y) direction as shown in FIG. 3 just like the main data lines D1 to Dn. The gate electrodes of the selective MISQDS1 to MISQDSn are connected to a common selective gate signal line ST1 .electrically. The drain selecting MISQDS1 to MISQDSn are formed with an nMIS respectively.

On the other hand, a common source line CS is disposed so as to cross the main data lines D1 to Dn. This main source line CS is a metallic line formed in a wiring layer and it is connected/disconnected to/from the sub-source lines SS1 to SSn via selective MISQSS1 to MISQSSn. In other words, the source lines are also divided into main and sub-hierarchical layers. The sub-source lines SS1 to SSn are formed in an n-type semiconductor region (the above source forming semiconductor region 3S) formed on the substrate 1 and they are disposed in parallel to the sub-data lines SD1 to SDn. The gate electrodes of the selective MISQSS1 to MISQSSn are connected to a common selective gate signal line ST2 electrically. Each of the source selecting MISQSS1 to MISQSSn is also an nMIS.

The memory cells MC11 to MCmn are arrayed in rows and columns. Each group consisting of a plurality of memory cells in a parallel connection in the same column, that is, a group of MCl1 to MCm1, a group of MC12 to MCm2, . . . a group of MC1n to MCmn are referred to as an AND unit UNT respectively. For example, memory cells MCl1 to MCm1, MC12 to MCm2, etc. are disposed in units of m cells in parallel connection between a sub-data line SD1 and a sub-source line SS1, between the sub-data line SD2 and the sub-source line SS2, . . . respectively.

The control gate electrodes of the memory cells MC11 to MCn, MC21 to MC2n, . . . , MCm1 to MCmn disposed in the same row are connected to common word lines W1 to Wm electrically. The word lines W1 to Wm are disposed so as to cross the main data lines D1 to Dn respectively.

Figure 4:
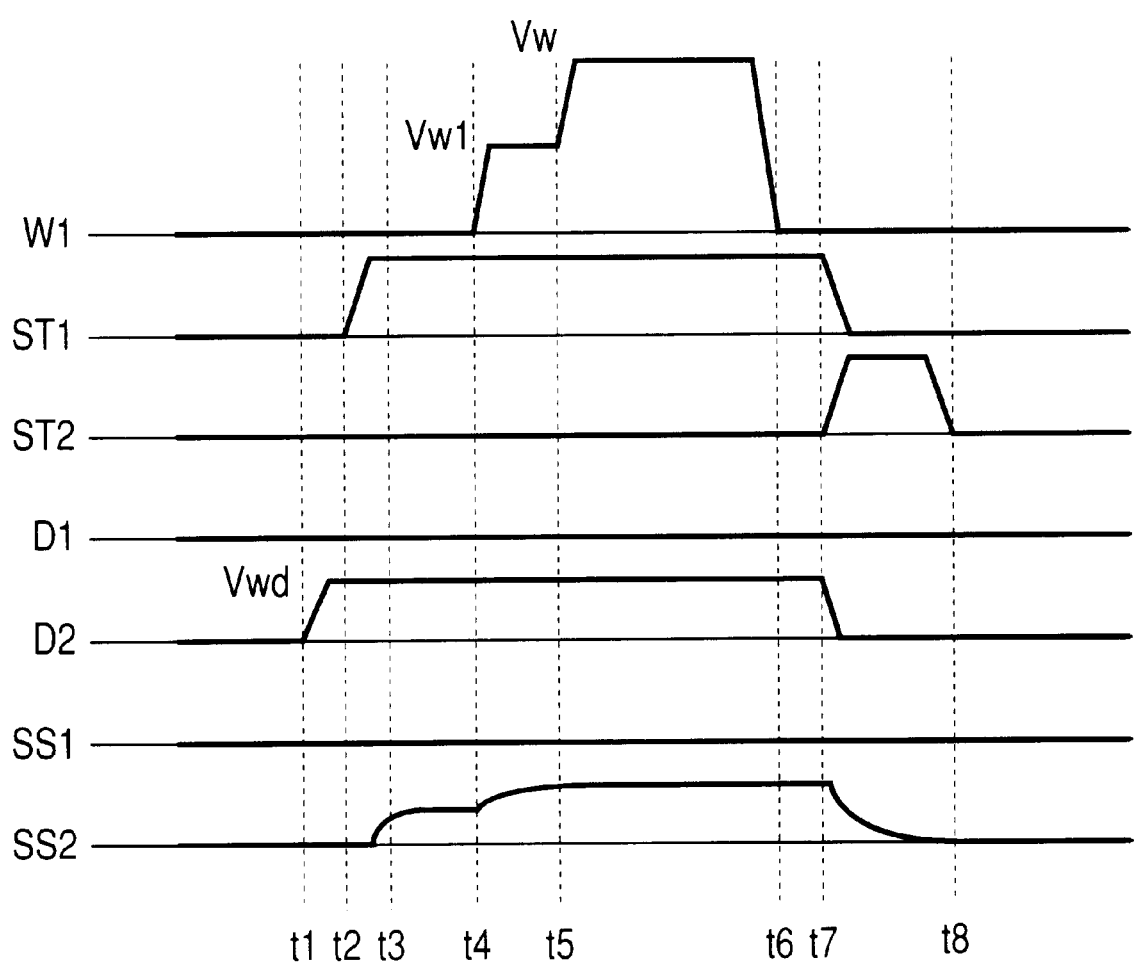
FIG. 4 is a timing flowchart of data writing in one memory cell shown in FIG. 3.

Next, a description will be made for data writing in the flash memory (EEPROM) in this embodiment with reference to FIGS. 3 through 5. FIG. 4 shows a timing flowchart of data writing in one memory cell shown in FIG. 3, for example, the selected memory cell MC11 connected to the word line W1. FIG. 5 shows an explanatory cross sectional view of a potential change in a non-selected memory cell during the above writing. Each dotted line in FIG. 5 denotes extension of the barrier layer of the memory cell. The Vg shown in FIG. 5 denotes a voltage to be applied to the control gate electrode 7 of the non-selected memory cell MC12 (that is, the word line W1)

At first, a ground voltage of, for example, 0V is applied to the date line D1 connected to the selected memory cell MC11 and a writing disable voltage Vwd of, for example, about 6V is applied to the data line D2 connected to the non-selected memory cell MC12. Then, the voltage of the selective gate signal line ST2 is driven into 0V to turn off the selective MISQSS1 to MISQSSn and set the sub-source lines SS1 and SS2 in the floating state (open) respectively (during the time t1 to t2 in FIG. 4).

After this, a voltage of, for example, about 10V is applied to the selected gate signal line ST1 to turn on the selected MIS(QDS1 to QDSn). Consequently, the sub-data lines SD1 and SD2 are charged to 0V and 6V respectively (during the time t2 to t3 in FIG. 4). In other words, in this embodiment, prior to the channel forming on the main surface of the substrate 1 of the non-selected memory cell MC12 connected to the selected word line W1 electrically, the control gate electrode 7 of the non-selected memory cell MC12 and the potential of the p-well. PWL are set to 0V respectively and the potential of the source forming semiconductor region 3S is set in the floating state, then a voltage of 6V is. applied to the drain forming semiconductor region 3D.

Figure 5A:
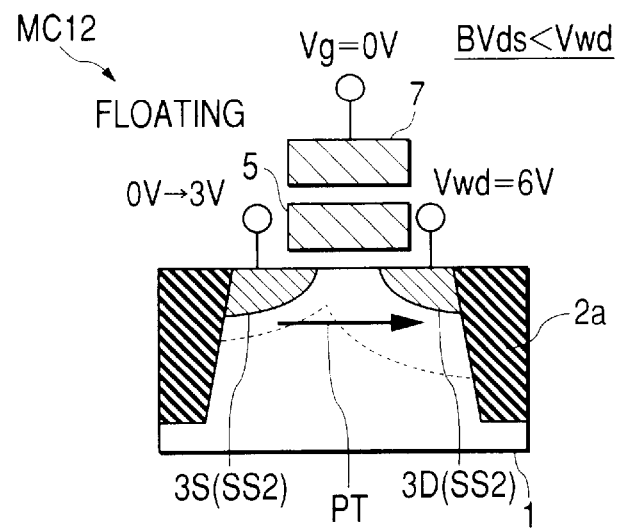
FIGS. 5A to C are explanatory cross sectional views for denoting how the potential of a non-selected memory cell changes in the event of data writing according to the timing flowchart shown in FIG. 4.

In this embodiment, the source-drain punch-through withstand voltage BVds is set smaller than the writing disable voltage Vwd in each of the memory cells MC11 to MCmn as described above. Consequently, as shown in FIG. 5A, the barrier layer of the drain forming semiconductor region 3D is extended up to the barrier layer of the opposed source forming semiconductor region 3S, thereby the semiconductor regions 3D and 3S are connected to each other electrically (punch-through PT) And, this is why a charging current flows from the 3D to the 3S in a region slightly deeper than the channel of the p-well PWL in the non-selected memory cell MC12. As a result, the potential of the source forming semiconductor region 3S, which has been in the floating state, can be raised to, for example, about 3V independently of the channel. At this time, no disturbance is caused by the injection of hot electrons described above due to the reasons that the charging current caused by the punch-through PT flows in the p-well PWL that is a little deeper than the channel and that the voltage of the control gate electrode is 0V (that is, hot electrons, even when they are generated, are not flown toward the floating gate electrode side), etc. And, because the writing disable voltage Vwd is lower than the drain-well withstand voltage BVdj of memory cells, no current flows between the drain and the well of any memory cell. Consequently, charging of source lines can be done satisfactorily. In addition, no current is consumed wastefully. Due to the reasons described above, the potential of the sub-source line SS2 rises step by step. When the sub-source line SS2 is charged up to the potential defined for that between the writing disable voltage Vwd and punch-through withstand voltage BVds, the punch-through current is shut off, thereby charging of the sub-source line SS2 stops (during the time t3 to t4 in FIG. 4).

After this, the sub-source line SS2 is charged up to the potential defined for that of the writing disable voltage Vwd and punch-through withstand voltage BVds, then the voltage of the word line W1 is raised to the first voltage Vw1 (during the time t4 to t5 in FIG. 4). The first voltage Vw1 is sufficient to turn on all the memory cells MC11 to MC1n connected to the word line W1 electrically and to charge the writing disable voltage Vwd into the selected sub-source line. Concretely, this means that the first voltage Vw1 should be, for example, 8V.

Figure 5B:
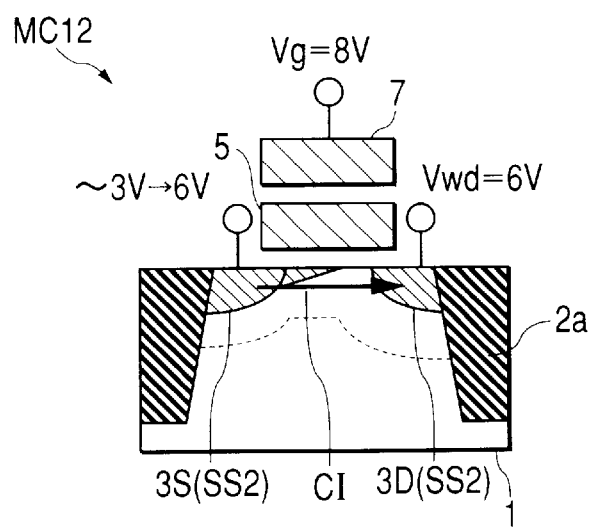

In the selected memory cell MC11, therefore, the ground voltage is applied to the sub-source line SS1 via the channel of the MC11. On the other hand, in the non-selected memory cell MC12, as shown in FIG. 5B, the writing disable voltage Vwd is transferred to the sub-source line SS2 from the data line D2 via the channel of the memory cell MC12, thereby the sub-source line SS2 is charged from the Vwd-BVds up to the writing disable voltage Vwd. In this embodiment, because the potential of the sub-source line SS2 rises slightly due to the punch-through described in FIG. 5A at this time, the channel current CI used to charge the sub-source line SS2 can be reduced. Consequently, the source-drain electric field can be eased. In addition, because the voltage of the control gate electrode 7 can be reduced relatively, hot electrons, even when they are generated, are not flown toward the floating gate electrode 5. This is why injection of hot electrons generated by the channel current CI can be suppressed or prevented. In other words, it is possible to suppress or prevent the write disturbance phenomenon to occur in the write disabled non-selected memory cell MC12.

Figure 5C:
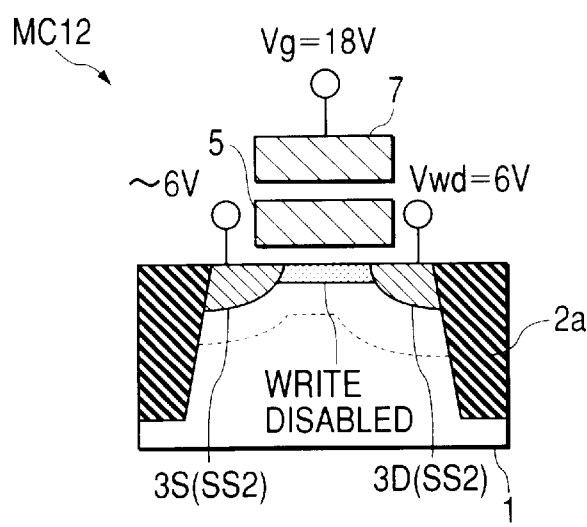

After this, the write voltage Vw of the selected word line W1 is raised to, for example, about 18V. In other words, the voltage Vg is set to Vw (during the time t5 to t6 in FIG. 4) in the control gate electrodes 7 of the memory cells MC11 to MC1n. In the selected memory cell MC11, therefore, electrons are injected in the floating gate electrode 5 from all over the channel surface having the ground potential, formed on the main surface of the substrate 1 due to the FN (Fowler-Nordheim) tunneling phenomenon, thereby data is written in the MC11. On the other hand, in the non-selected memory cell MC12, because the channel potential is raised to about 6V, thereby the gate electric field is eased as shown in FIG. 5C, injection of electrons into the floating gate electrode 5 can be suppressed, thereby no data is written in the MC12.

After this, to stop injection of electrons, the word line W1 is driven into the ground potential (at t6 in FIG. 4), then the selected gate signal line ST1 is inactivated to turn off the selected MISDS(1 to n) while the selected gate signal line ST2 is activated to turn on the selected MIS(QSS1 to QSSn), thereby the selected source and data lines are discharged (during the time from t7 to t8 in FIG. 4).

According to this embodiment as described above, the following effects can be obtained.

(1) It is possible to charge the sub-source line SS2 up to a certain potential level before a channel is formed in the non-selected memory cell MC12 by making good use of the punch-through phenomenon to occur in the memory cells MC11 to MCmn. Consequently, it is possible to suppress injection of hot electrons in the non-selected memory cell MC12, thereby suppressing or preventing the write disturbance phenomenon to occur therein.

(2) In the above example, a description has been made for a plurality of memory cells MC11 to MC1n connected to the selected word line W1 electrically. However, according to the technique described with reference to FIGS. 23 through 25, the write disturbance phenomenon caused by the above-described hot electrons might also occur in the memory cells MC62, etc. connected to both of the non-selected word line W2 electrically and a non-selected data line in some cases, since a transient channel current flows to charge the sub-source line SS52 while a positive voltage is applied to the control gate electrode and the drain of each of the MC62, etc. during a write operation. In such a case, this embodiment is effective to suppress or prevent the write disturbance phenomenon that might occur in such non-selected memory cells, since the same action as that described above can be made in them (ex., MC22, etc. in FIG. 3).

(3) The data retention characteristics of the flash memory (EEPROM) can be improved due to the effects in (1) and (2) described above. Consequently, the rewriting frequency of the flash memory (EEPROM) increases. In addition, the reliability of the flash memory (EEPROM) can be improved.

(4) It is possible to suppress or prevent the write disturbance phenomenon that might occur in non-selected memory cells, since the first voltage Vw1, which is lower than a write voltage Vw, is applied to the selected word line W1 before the write voltage Vw is applied thereto during data writing. The first voltage Vw1 is lower than the write voltage Vw. In other words, in the case where a high write voltage Vw is applied to the selected word line W1 from the beginning, it causes a tunnel current to flow in the non-selected memory cells and hot electrons to be generated in those memory cells in some cases. This is why the first voltage Vw that is lower than the write voltage Vw is applied the selected word line W1 before application of the write voltage Vw thereto, thereby such problems can be suppressed or prevented.

(5) There is also another technique that can prevent such a write disturbance phenomenon that might occur in non-selected memory cells due to the above-described hot electrons. According to the technique, a short-circuiting MIS is connected electrically to each memory cell in parallel in each AND unit and this short-circuiting MIS is used to charge a selected sub-source line in a write disable operation. Unlike this technique, however, this embodiment can omit the use of such short-circuiting MISs, so that there is no need to provide peripheral and power supply circuits having required so far to operate those short-circuiting MISs.

Consequently, the chips can be reduced in size. In addition, the memory cell disposition area can be expanded, thereby the number of memory cells to be disposed can be increased and the total memory capacity can be increased. Furthermore, because no short-circuiting MIS is used, there is no need to adjust the operation timing, etc. having been required for the short-circuiting MISs, thereby the total operation of the flash memory (EEPROM) circuit is simplified.

Second Embodiment

This second embodiment is the same as the first embodiment in configuration except that short-circuiting MISs are disposed as described above in each AND unit. FIG.

Figure 6:
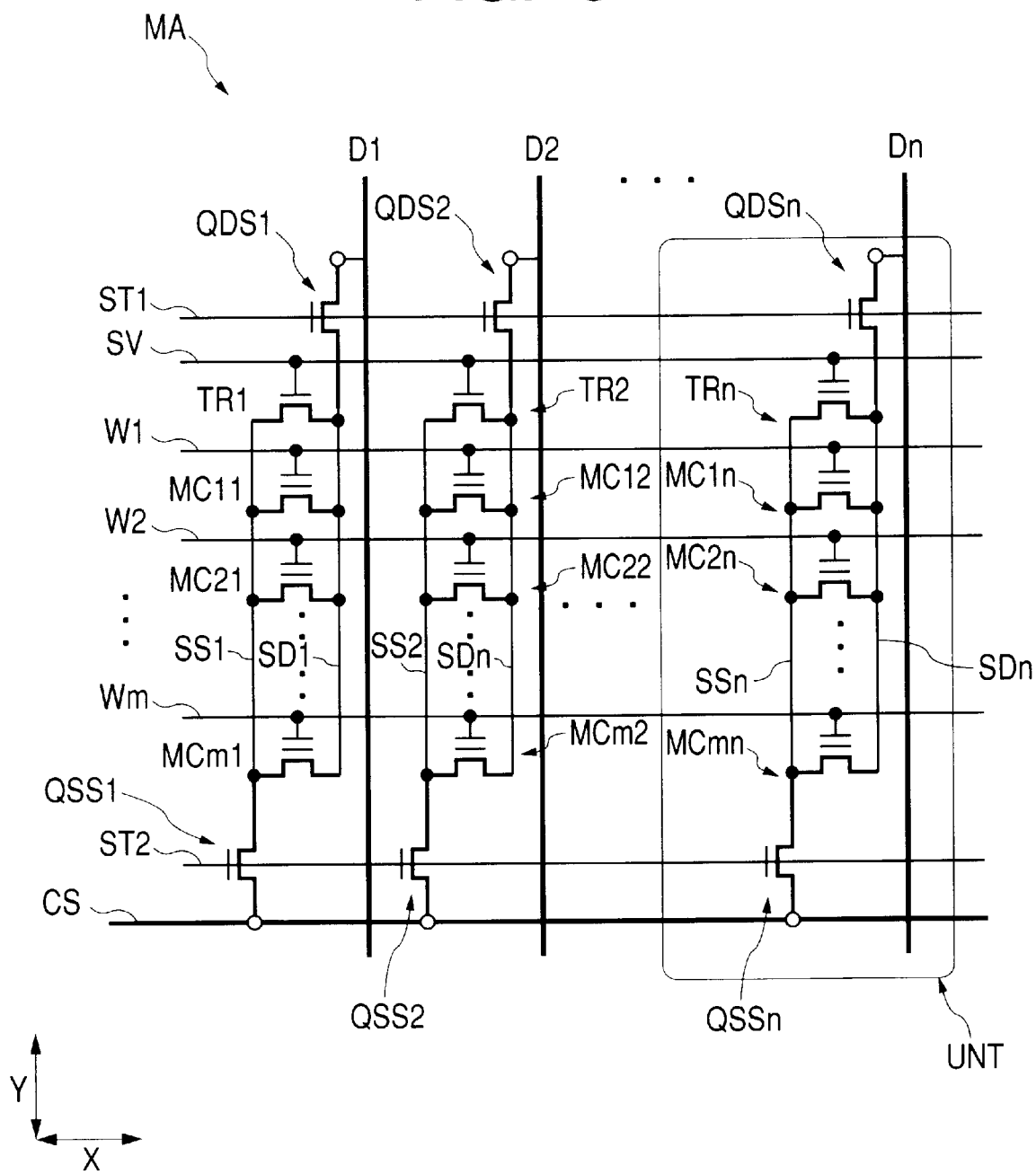
FIG. 6 is a circuit diagram of the major part of a memory array in the flash memory (EEPROM), which is another embodiment of the present invention.

FIG. 6 shows a circuit diagram of a memory array MA in an AND type flash memory (EEPROM) in this second embodiment. In each AND unit UNT, a short-circuiting MIS(TR1 to TRn) is connected electrically to each of the memory cells MC11 to MCmn in parallel therein. A short-circuiting MIS is composed of an nMIS; the drain is connected to a sub-data line SD(1 to n) electrically, the source is connected to the sub-source lines SS1 to SSn electrically, and the gate is connected to a selected line SV electrically. When the short-circuiting MIS is on, the sub-data line and the sub-source line connected thereto become conductive.

FIG. 7 shows an explanatory cross sectional view of the major part of the short-circuiting MIS(TR1 to TRn) The short-circuiting MISTR includes a pair of n-type semiconductor regions 3D and 3S formed so as to oppose each other at an interval therebetween in a p-well PWL, a gate insulator 3 formed on the main surface of the p-well PWL between those 3D and 3S, and a gate electrode 8 formed on the insulator 3. The n-type semiconductor regions 3D and 3S are used to form the drain and the source of each short-circuiting MISTR. The drain forming n-type semiconductor region 3D is formed with part of a sub-data line SD(1 to n) and the source forming n-type semiconductor region 3S is formed with part of a sub-source lines SS(1 to n). The gate electrode 8 is formed with part of the above selective line SV.

Next, the write operation of the flash memory (EEPROM) in this second embodiment will be described with reference to FIGS. 6 and 8. FIG. 8 shows a timing flowchart of data writing in one memory cell shown in FIG. 6, for example, in the selected memory cell MC11 connected to the word line W1.

At first, a ground voltage is applied to the data line D1 connected to the selected memory cell MC11, then a writing disable voltage Vwd of, for example, about 6V is applied to the data line D2 connected to the non-selected memory cell MC12 (at the time t1 in FIG. 8).

After this, a voltage of, for example, about 10V is applied to the selected gate signal line ST1 to turn on the selected MIS(QDS1 to QDSn) (at the time t2 in FIG. 8). At this time, the sub-data lines SD1 and SD2 are charged to 0V and 6V respectively.

At this time, how the potential changes in the non-selected memory cells MC12 to MCm2 connected to the sub-data line SD2 is the same as that shown in FIG. 5. For example, in the non-selected memory cell MC12 connected to the selected word line W1 electrically, the barrier layer of the drain is extended up to the barrier layer of the opposed source, thereby a punch-through phenomenon occurs and connects the barrier layers to each other. As a result, a charging current flows from the drain to the source in a region that is a little deeper than the channel of the p-well PWL. The potential of the sub-source line SS2 thus rises gradually and it is charged up to the potential defined for Vwd-BVds. Then, the punch-through current is shut off and charging of the sub-source line SS2 stops (during the time t2 to t3 in FIG. 8).

After the sub-source line SS2 is charged to the potential defined for Vwd-BVds, the voltage of the short-circuiting MIS(TR1 to TRn) rises up to the first voltage VwTR. In this case, it is premised that the voltage VwTR is, for example, about 8V sufficient to turn on the short-circuiting MISTR, then charge a writing disable voltage to the selected sub-source line via this MISTR. Then, a channel is formed in the surface layer of the short-circuiting MIS(TR1 to TRn) and the writing disable voltage Vwd is transmitted from the data line D2 to the sub-source line SS2 via the MISTR1. Consequently, the sub-source line SS2 is charged from the Vwd-BVs potential up to the writing disable voltage Vwd (during the time from t3 to t4 in FIG. 8). The selected memory cell MC11 transfers the ground voltage also to the sub-source line SS1.

After this, the voltage of the selected word line W1 is raised to a write voltage Vw of, for example, about 18V. In the selected memory cell MC11, therefore, electrons are injected in the floating gate electrode 5 from all over the surface of the channel having the ground voltage, formed on the main surface of the substrate 1, thereby data is written in the memory cell MC11. On the other hand, in the non-selected memory. cell MC12, because the channel potential is raised to about 6V and the gate electric field is eased, thereby injection of electrons in the floating gate electrode 5 is suppressed. No data is thus written in the memory cell MC12. The subsequent operations are the same as those in the first embodiment, so the description for them will be omitted here.

Next, an example of how to fabricate the flash memory (EEPROM) in this second embodiment will be described with reference to FIGS. 9 through 13. In FIGS. 9 through 13, A shows a cross sectional view of the major part of a memory array in the word line direction, B shows a cross sectional view of the major parts of both memory array and short-circuiting MIS in the data line direction orthogonal to the word line direction A.

Figure 9A:
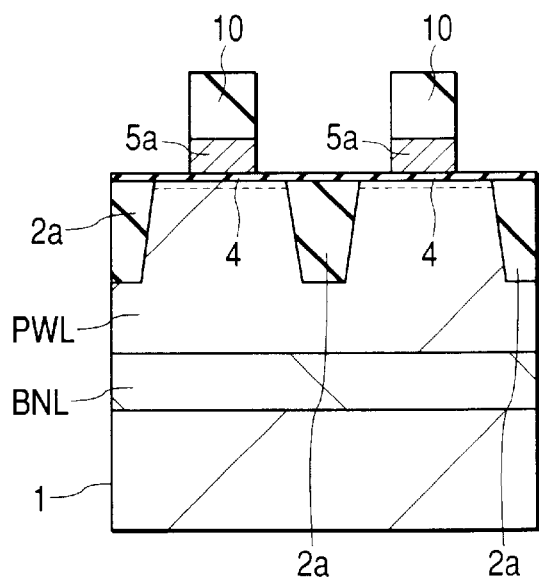
FIGS. 9A and B are cross sectional views of the major part of the flash memory (EEPROM) shown in FIG. 6 in a fabrication process.
Figure 9B:
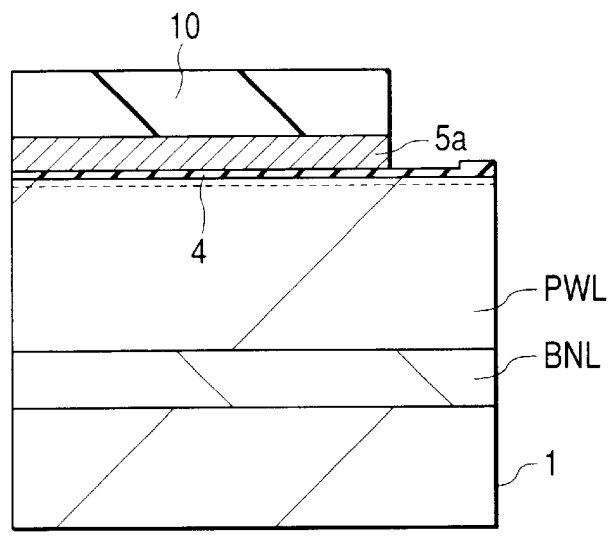

FIG. 9 shows a cross sectional view of the major part of the flash memory (EEPROM) in the second embodiment in a fabrication process. The substrate 1 (a flat circle-like semiconductor thin plate referred to as a semiconductor wafer in this stage) is composed of, for example, p-type single crystal silicon. The above-described p-well PWL is formed on the main surface of this substrate 1.

In this second embodiment, the impurity density in the surface layer of the p-well PWL is higher than that of any of the layers deeper than the surface layer. Although not limited specially, for example, the following impurities are implanted in the surface layer. Firstly, for example, about 75 keV of boron is implanted at a density of 2 to $3 \times 10^{12}/cm^2$. This is a basic process for implanting the impurity to form a p-well PWL. Secondly, for example, about 40 keV of boron is implanted at about $2 \times 10^{12}/cm^2$. This is a process for implanting the boron under the source and drain forming semiconductor regions of memory cells. In this second embodiment, the dose is set comparatively low so as to generate a punch-through phenomenon between the source and the drain of each memory cell upon the application of the writing disable voltage Vwd as described above. Thirdly, for example, about 50 keV of boron difluoride (BF2) is implanted at about 1 to $2\times10^{13}/cm^2$. This is a process for implanting the impurity in the surface layer of the substrate 1 to set a threshold voltage in memory cells.

The p-well PWL formed as described above is enclosed by an n-well BNL embedded in the lower layer and an n-well formed at the side wall of the p-well PWL, so that it is isolated from the substrate 1 electrically. The embedded n-well BNL and the n-well are formed by implanting, for example, phosphorus (P) or arsenic (As) in the substrate 1 and used to suppress or protect the memory formed on the substrate 1 from noises generated by elements other than those of the memory, as well as to set a predetermined potential value of the p-well PWL independently of the substrate 1.

The gate insulator 4 is formed in an active region on the main surface of the substrate 1. The gate insulator 4 is composed of, for example, silicon oxide at a thickness of 9 to 10 nm. A flat band-like conductive pattern film 5a is formed on this gate insulator 4. The conductive film 5a is used to form the above-described gate electrode 5. It is composed of, for example, low resistance polycrystal silicon of about 70 nm in thickness. A cap insulator 10 composed of, for example, silicon nitride (SixNy), etc. is laminated on this conductive layer 5a.

Figure 10A:
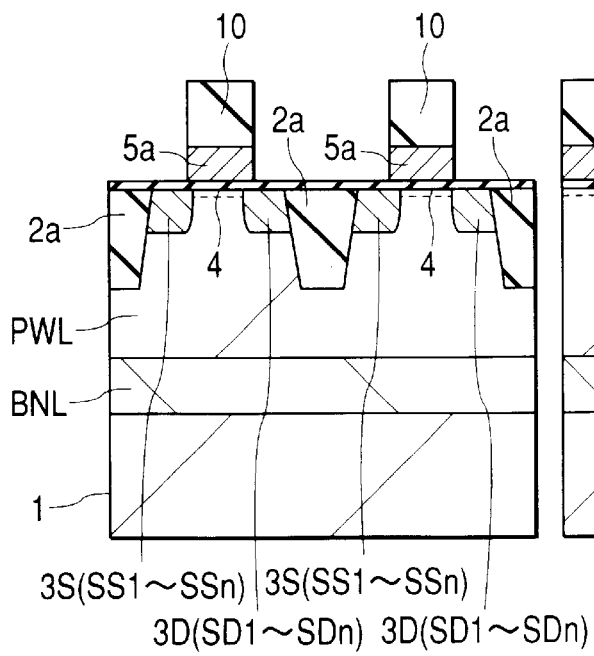
FIGS. 10A and B are cross sectional views of the major part of the flash memory (EEPROM) shown in FIG. 6 in another fabrication process following the process shown in FIG. 9.
Figure 10B:
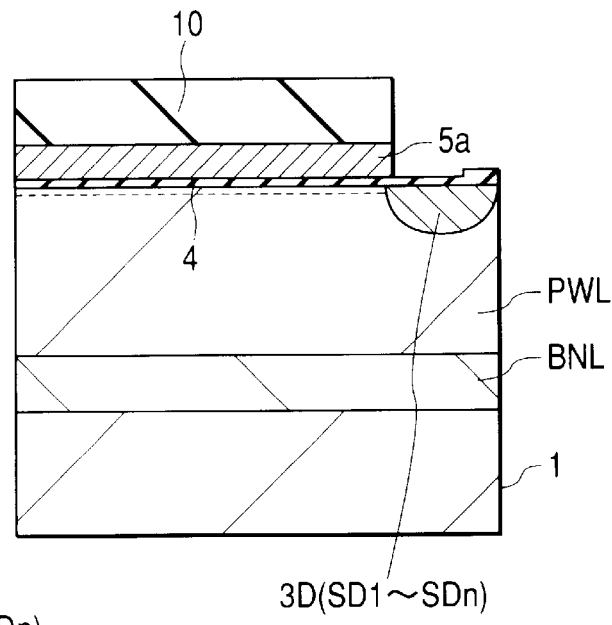

Impurities are then implanted in the substrate 1 formed as described above to form the source and the drain of each memory cell. As a result, the source and drain forming n-type semiconductor regions 3S and 3D (sub-date lines SD1 to SDn and sub-source lines SS1 to SSn) are formed as shown in FIG. 10. The impurity implanted at this time is, for example, boron at a density of $10^{14}/cm^2$. This selection of boron as the impurity makes it possible to form a shallow junction between the semiconductor regions 3D and 3S, as well as increase the impurity density while generation of a short channel effect, etc. is suppressed or prevented. This is why the resistance (sheet resistance) can be lowered even in the refining process while the reliability of the flash memory (EEPROM) is kept assured.

Figure 11A:
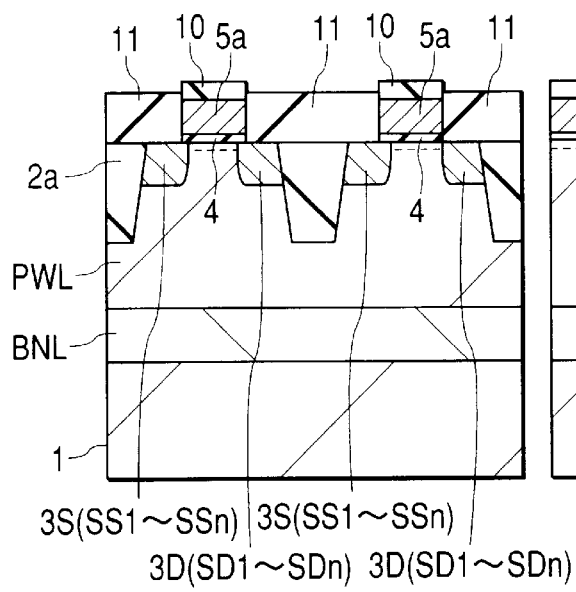
FIGS. 11A and B are cross sectional views of the major part of the flash memory (EEPROM) shown in FIG. 6 in still another fabrication process following the process shown in FIG. 10.
Figure 11B:
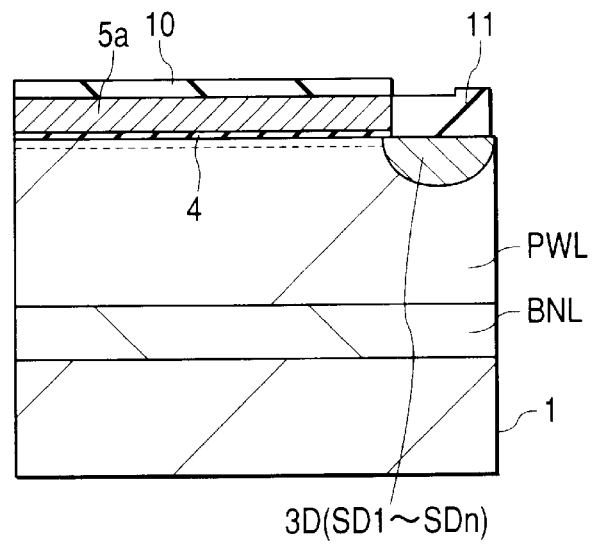

After this, an insulator composed of, for example, silicon oxide is deposited by the CVD method or the like, then the insulator is polished by the CMP (Chemical Mechanical Polishing) method and etched by the dry-etching method. At this time, the insulator 11 is left over in recesses of the surface layer of on the substrate 1 as shown in FIG. 11 so as to make the main surface of the substrate 1 flat. The cap insulator 10 functions to protect the lower layer at this time. The cap insulator 10 is also polished off at its top portion.

Figure 12A:
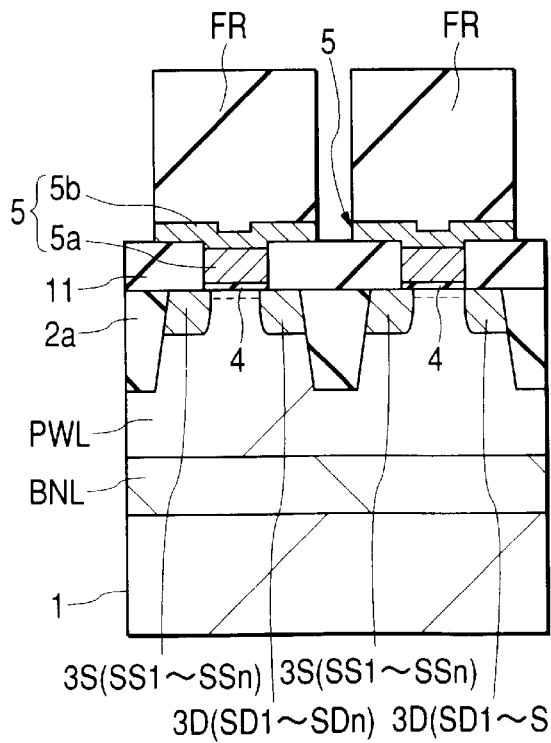
FIGS. 12A and B are cross sectional views of the major part of the flash memory (EEPROM) shown in FIG. 6 in still another fabrication process following the process shown in FIG. 11.
Figure 12B:
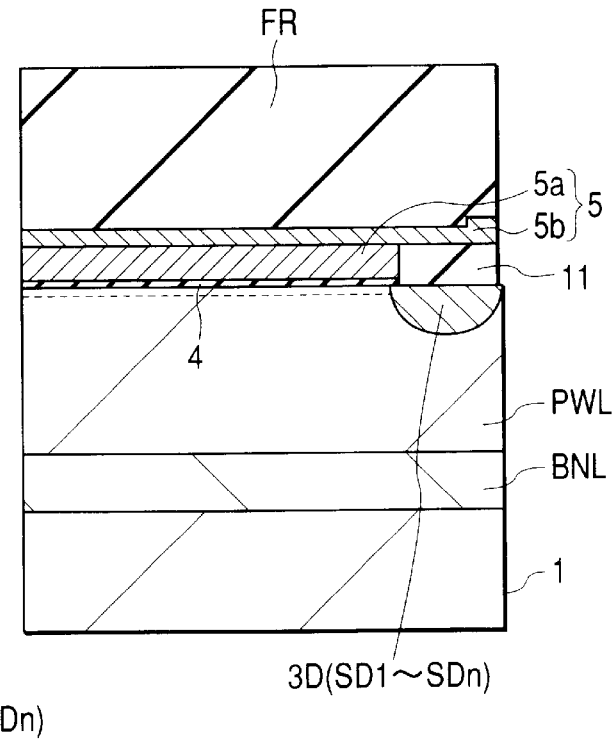

After this, the cap insulator 10 is removed, then a conductive layer 5b composed of low resistance polycrystal silicon is deposited on the main surface of the substrate 1 by the CVD method or the like at a thickness of, for example, about 40nm as shown in FIG. 12. Furthermore, photo-resist FT is patterned on the conductive layer 5b. The photo-resist FR functions as a masking pattern for forming floating gate electrodes. After this, the conductive layer 5b exposed from the photo-resist FR used as an etching mask is etched to form the floating gate electrode 5. The floating gate electrode 5 is composed of conductive layers 5a and 5b. In other words, the floating gate electrode 5 is formed with a laminated layer of the conductive layers 5a and 5b. In this second embodiment, the cross section of the floating gate electrode 5 is shaped like the letter T. In other words, the conductive layer 5b is wider than the conductive layer 5a. Consequently, the area of the floating gate electrode facing the control gate electrode can be increased while the memory cell channel is kept short in length. It is thus possible to improve the coupling ratio between those gate electrodes, thereby the operation efficiency of the memory cells can be improved even in the refined state. The gate length of the memory cell is, for example, about 0.2 (m in this case. The cross section of the floating gate electrode 5 may also be shaped like the letter I.

Figures 13A, 13B:
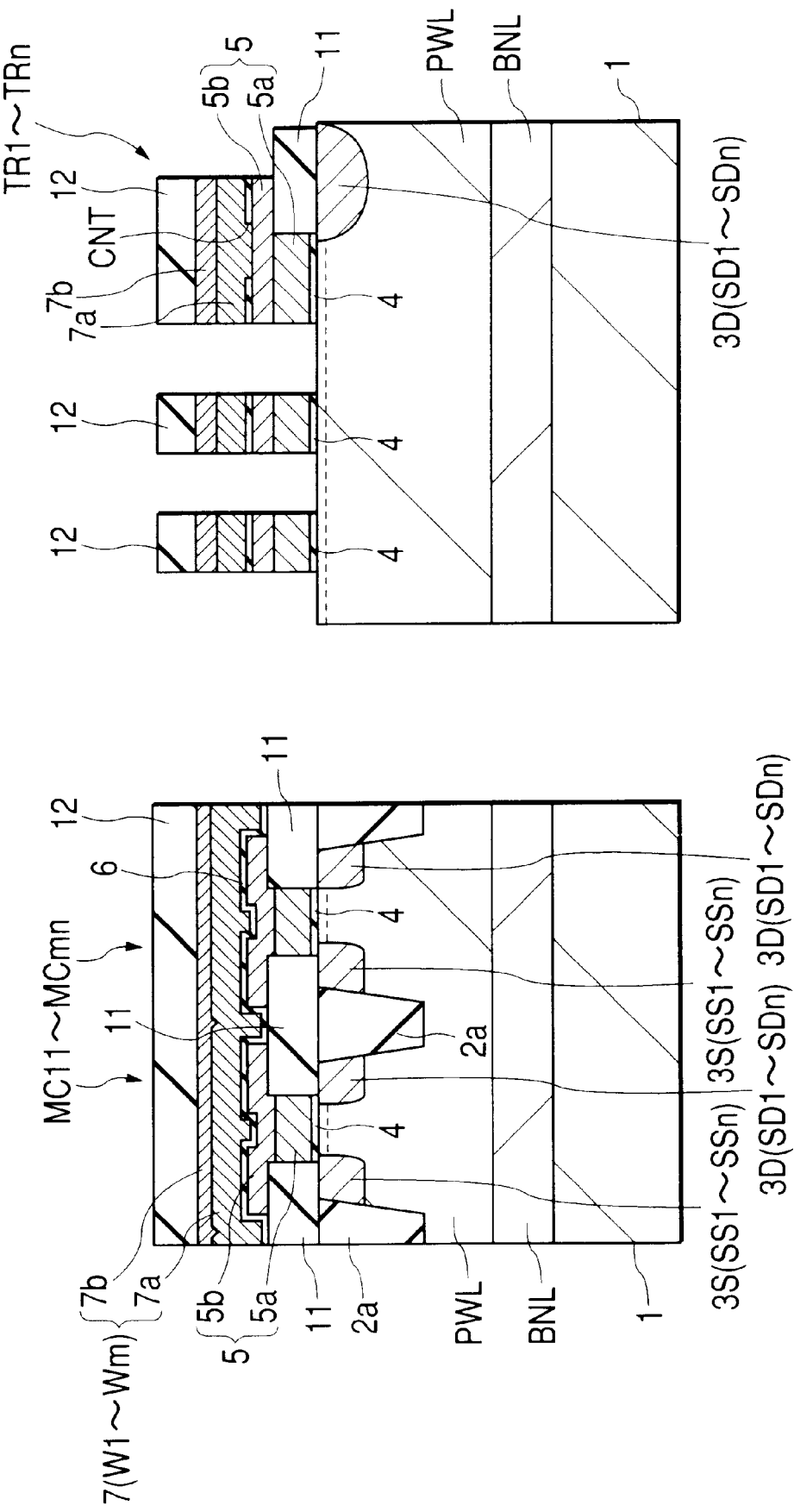
FIGS. 13A and B are cross sectional views of the major part of the flash memory (EEPROM) shown in FIG. 6 in still another fabrication process following the process shown in FIG. 12.

Next, for example, a silicon oxide layer, a silicon nitride layer, and a silicon oxide layer are deposited on the main surface of the substrate 1 sequentially with the CVD method or the like to form an interlaminar layer 6 of, for example, about 15 nm in thickness as shown in FIG. 13. After this, a contact hole CNT is formed in the interlaminar layer 6 in the short-circuiting MIS formed region so as to expose the conductive layer 5a. Then, a conductive layer 7a composed of, for example, low resistance polycrystal silicon, a conductive layer 7b composed of such silicide as tungsten silicide or the like, and a cap insulator layer 12 composed of silicon oxide in the contact hole CNT and on the interlaminar layer 6 respectively are disposed sequentially with the CVD method or the like, then the laminated layer is patterned with photo-lithography and dry-etching techniques. Consequently, control gate electrodes 7 (word lines W1 to Wn) are formed in the memory array and the gate electrodes 8 of the short-circuiting MISTR1 to MISTRn are formed in other regions. In each control gate electrode 7 (word lines W1 to Wm), the conductive layers 7a and 7b are deposited thereon and connected to each other electrically. In each gate electrode 8, conductive layers 5a, 5b, 7a, and 7b are deposited thereon and connected to each another electrically. In the memory array, memory cells MC11 to MCmn and the short-circuiting MISs (TR1 to TRn) are formed such way.

In addition to the effects (1) to (3) obtained in the first embodiment, the following excellent effects can also be obtained in this second embodiment.

(1) Before forming a channel in each memory cell, the potential of the sub-source line can be charged to the writing disable voltage Vwd by making good use of the punch-through phenomenon to occur in the memory cell itself, as well as the short-circuiting MIS(TR1 to TRn) Consequently, injection of hot electrons in each non-selected memory cell can be suppressed completely, thereby the data retention characteristics of the flash memory (EEPROM) is further be improved. In addition, the data rewriting frequency of the flash memory (EEPROM) increases.

(2) Before charging the sub-source line using the short-circuiting MIS(TR1 to TRn), the potential of the sub-source line can be charged to a certain level with the punch-through phenomenon to occur in the memory cell itself, so that the charging amount of the sub-source line with the short-circuiting MIS(TR1 to TRn) can be reduced. Consequently, it is possible to lower the possibility that causes the characteristics of the short-circuiting MIS(TR1 to TRn) to be varied due to injection of hot electrons.

(3) The short-circuiting MIS(TR1 to TRn) can be protected and the imperfect gate dielectric resistance of the short-circuiting MIS(TR1 to TRn) can be reduced or prevented, since the voltage applied to the short-circuiting MIS(TR1 to TRn) repetitively can be lowered by starting charging of the selected sub-source line by the short-circuiting MIS(TR1 to TRn) after raising the potential of the sub-source line by making good use of the punch-through phenomenon of the memory cell itself.

(4) Write disturbance caused by injection of hot electrons in each non-selected memory cell can be suppressed or prevented by making good use of the punch-through phenomenon of the memory cell itself even if the short-circuiting MIS(TR1 to TRn) goes out of order.

(5) While a description has been made for charging of each selected sub-source line using a short-circuiting MIS(TR1 to TRn) started after the potential of the subject sub-source line is charged to a certain level by making good use of the punch-through phenomenon of each memory cell itself, the present invention is not limited only to the method; charging of the sub-source line may be started by making good use of the punch-through phenomenon of the memory cell itself after or when the selected sub-source line is charged by the short-circuiting MIS(TR1 to TRn). In this case, the effect in (4) in this second embodiment can be obtained.

Third Embodiment

In this third embodiment, the present invention applies to, for example, a NAND flash memory (EEPROM).

The memory cells of the flash memory (EEPROM) in this third embodiment are structured just like those in the above first and second embodiments and provided with the same characteristics as theirs. In other words, the relationship of Vr<BVds<Vwd<BVdj is also satisfied in this third embodiment.

Figure 14:
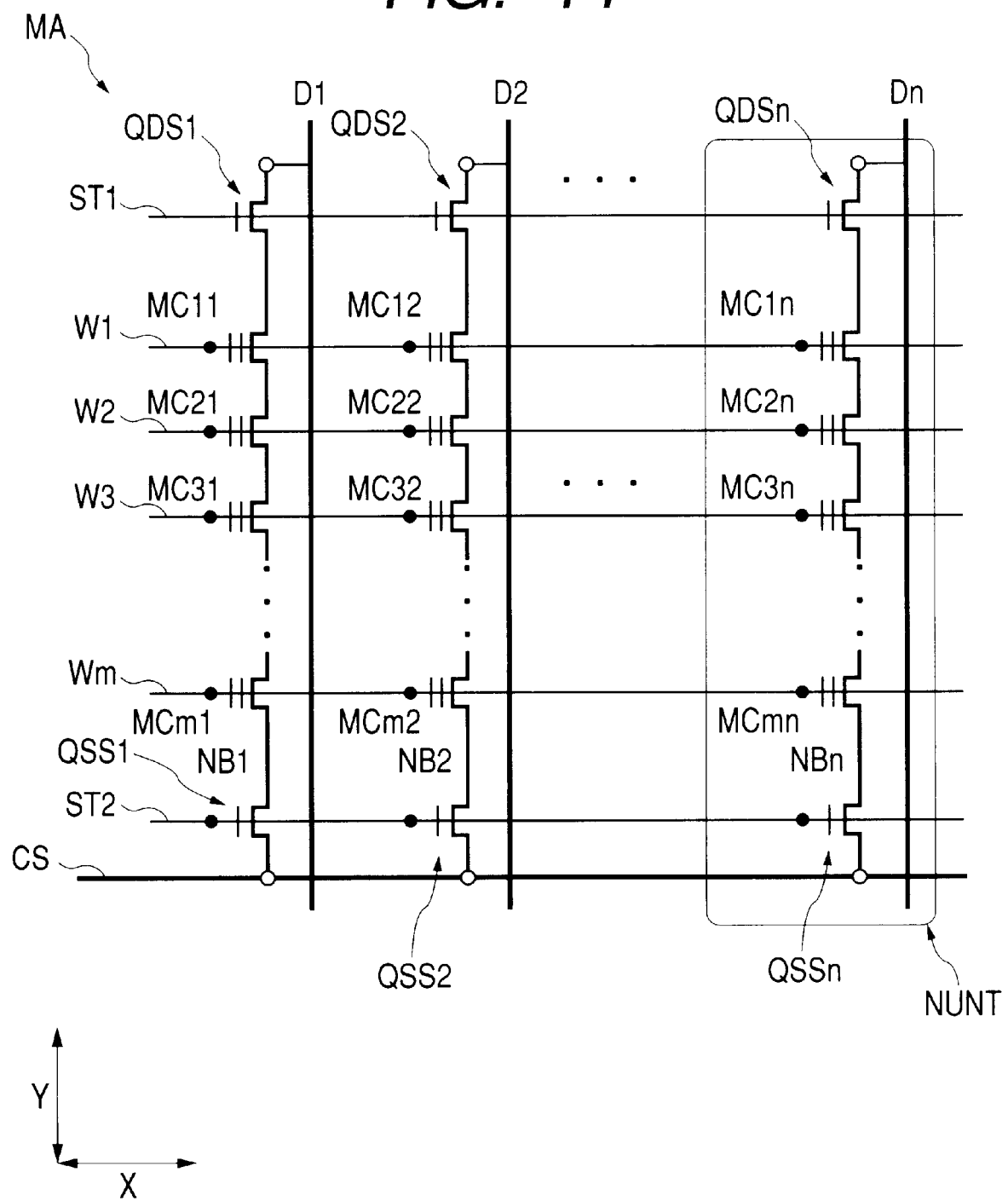
FIG. 14 is a circuit diagram of the major part of a memory array in the flash memory (EEPROM) in another embodiment of the present invention.

FIG. 14 shows a circuit diagram of a memory array MA in the NAND flash memory (EEPROM) in this third embodiment.

In the memory array in this third embodiment, the memory cells MC11 to MCmn are disposed in rows and columns. A predetermined number of memory cells MC11 to MCmn disposed in the same column are connected to each another serially to compose a NAND unit NUNT. Both ends of the NAND unit NUNT are connected to a main data line D(1 to n) and the common main source line CS via a selective MIS(QDS1 to QDSn) and a selective MIS(QSS1 to QSSn). The control electrodes of the memory cells MC11 to MCmn disposed in the same row are connected to the same word line (W1 to Wm) Data writing in each of the memory cells MC11 to MCmn is done just like in the first and second embodiments, that is, by injecting electrons in the floating gate electrode by means of the FN tunneling phenomenon.

Figure 15:
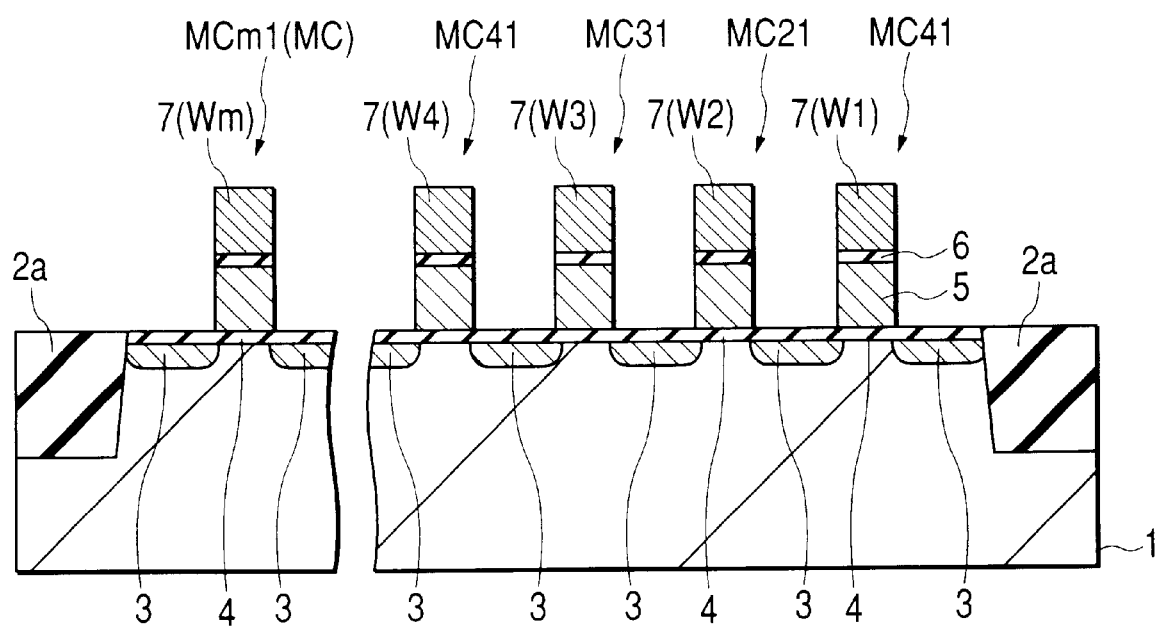
FIG. 15 is a cross sectional view of the major part of the flash memory (EEPROM) shown in FIG. 14.

FIG. 15 shows a cross sectional view of the substrate 1 in the NAND unit (in the direction orthogonal to a plurality of word lines W1 to Wm) shown in FIG. 14.

Each of the memory cells MC11 to MCm1(MC) includes source and drain forming n-type semiconductor regions. Those memory cells MC are connected to each another serially by sharing an n-type semiconductor region 3 located between respective memory cells (MC). The n-type semi-conductor region 3 is the same as the 3D/3S in the first and second embodiments. Other items in this third embodiment are the same as those in the first and second embodiments.

Figure 16:
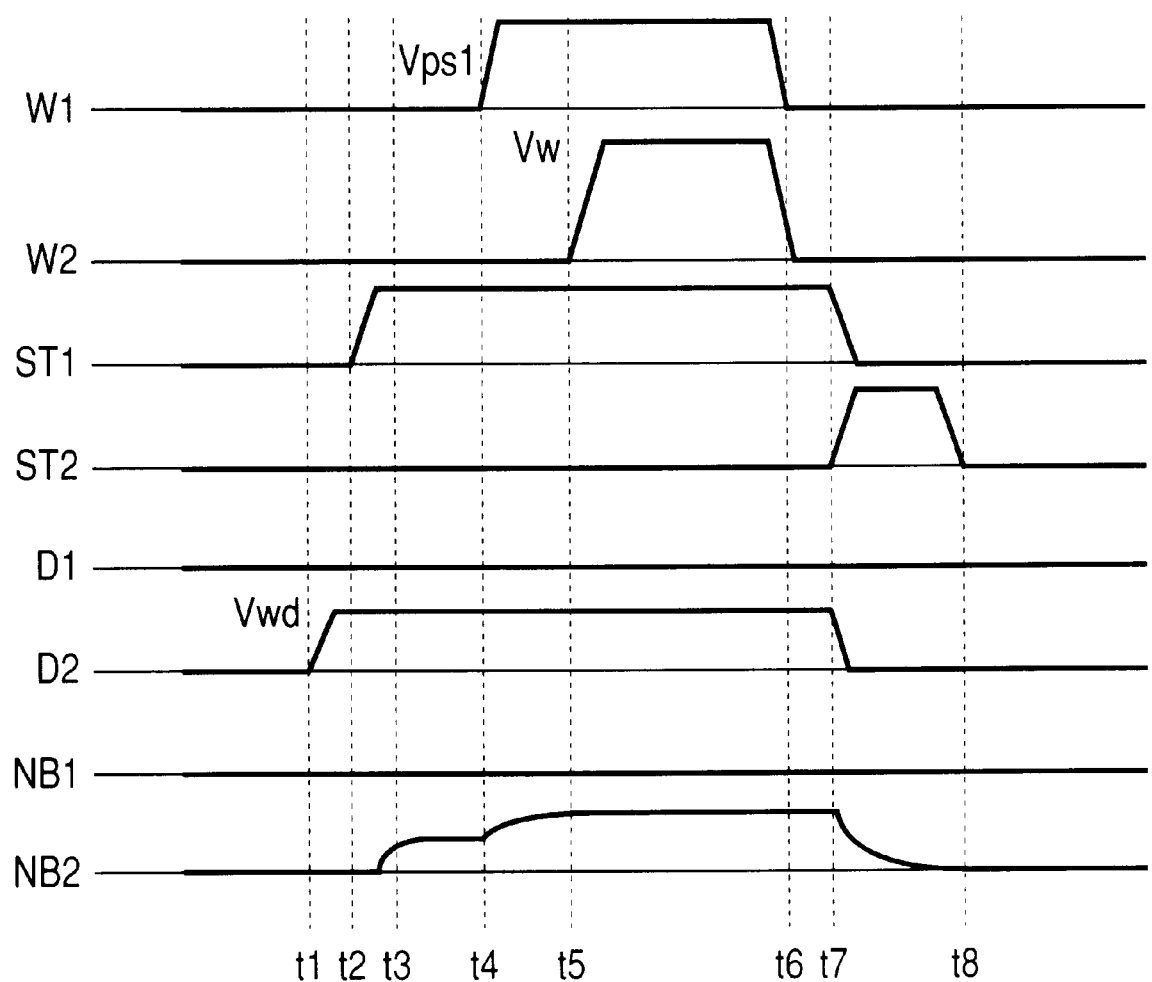
FIG. 16 is a timing flowchart of data writing in one memory cell shown in FIG. 14.

Next, the write operation of the flash memory (EEPROM) in this third embodiment will be described with reference to FIGS. 14 and 16. FIG. 16 shows a timing flowchart of data writing in one memory cell shown in FIG. 14, for example, the selected memory cell MC21 connected to the word line W2.

As shown in FIGS. 14 and 16, when data is to be written in the selected memory cell MC21, the voltage of the data line D1 connected to the selected memory cell MC21 is adjusted to the ground voltage, then a positive high voltage Vw of, for example, about 20V is applied to the word line W2.

The voltage of the selected gate signal line ST2 is driven to 0V to turn off the selected MISQSS1 and set the sub-source line (SS1 and SS2) in the floating state. At this time, a high voltage of about 20V is also applied to the control gate electrodes of the non-selected memory cells MC22, etc. connected to the same word line W2 electrically, so that writing must also be disabled for the non-selected memory cells MC22, etc. In this embodiment, it is possible at this time to suppress or prevent the write disturbance phenomenon that might occur in the non-selected memory cells just like in the first embodiment. Consequently, the same effects as those in the first embodiment can be obtained. The write disable timing is almost the same as that in the first embodiment. The description for the timing will thus be omitted here.

Fourth Embodiment

In this fourth embodiment, the present invention applies to the data erasing operation for a flash memory (EEPROM). Concretely, the flash memory (EEPROM) is characterized by collective erasing of data from all the memory cells or a group of memory cells in each memory array. However, this method arises the following problem: because data must be erased from a plurality of memory cells, that is, the threshold voltage must be lowered in a plurality of memory cells at a time, the erasing state might be varied among memory cells. In this case, depletion (that the threshold voltage is lowered excessively in some memory cells) might occur in some memory cells, since data is erased completely from each memory cell. For such depleted memory cells, data must be written back (so-called write-back operation) only in those depleted memory cells. Also in this case, it is expected that a write error (data is also written in some non-selected memory cells, that is, non-depleted memory cells) will occur in those non-selected memory cells due to the same phenomenon (write disturbance phenomenon) described in the first embodiment, since the write-back operation is writing data in memory cells. The object of this embodiment is to avoid such a problem. Although not limited specially, it is premised here that the memory cells and the memory arrays in this fourth embodiment are the same in both structure and configuration as those in the first embodiment.

Figure 17:
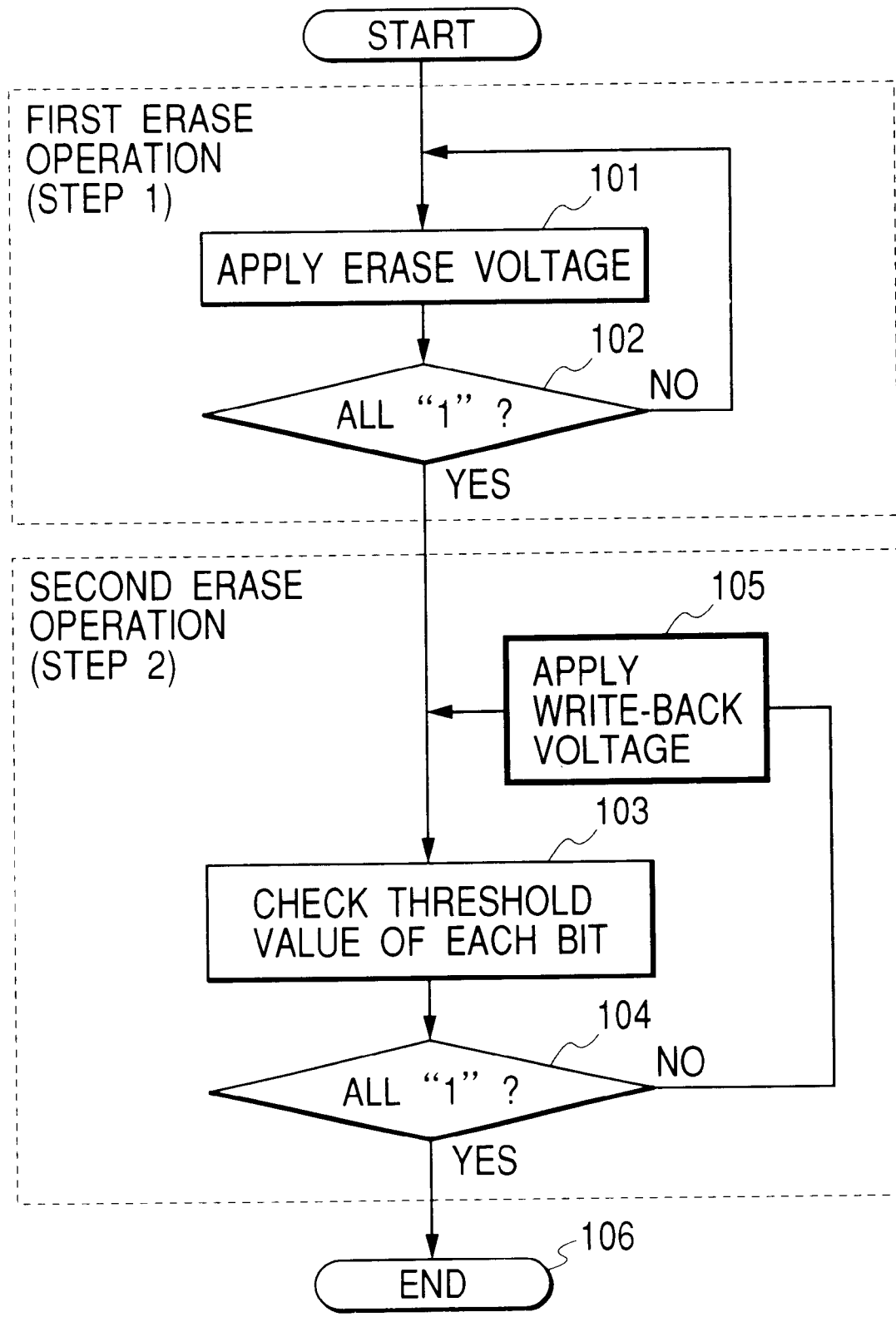
FIG. 17 is a flowchart of data erasing from the flash memory (EEPROM), which is another embodiment of the present invention.

FIG. 17 shows a flowchart of data erasing executed for the flash memory (EEPROM) in this fourth embodiment. FIGS. 18A through D show charts for denoting the distribution of the threshold values in the memory cells in each step in the flowchart.

In this fourth embodiment, data erasing is executed, for example, in two steps as shown below.

Figure 18A:
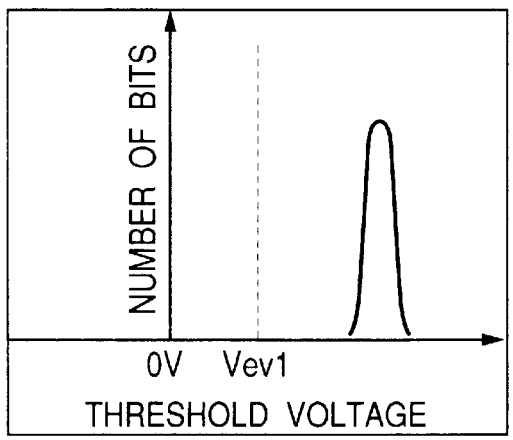
FIGS. 18A to D are charts for describing the distribution of threshold values in memory cells in each step of the flowchart shown in FIG. 17.
Figure 18B:
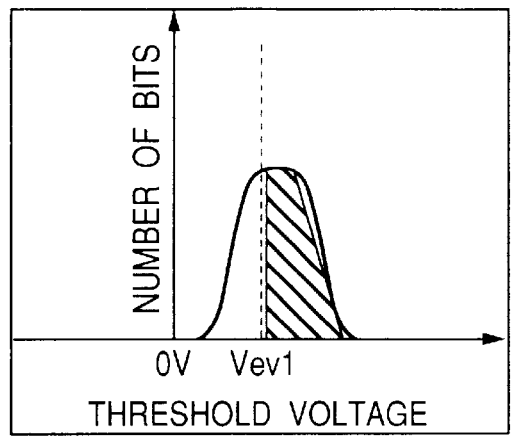

In step 1, an erasing operation is started, then an erase voltage is applied to the selected word line (step 101). It is then checked whether or not the threshold voltage in every selected memory cell is lower than a predetermined voltage Vev1 as shown in FIG. 18A. When the check result is NO (the threshold voltage in any memory cell is higher than the Vev1 as shown in FIG. 18B) control goes back to repeat the erase and check operations.

When the threshold voltage in every selected memory cell connected to the selected word line goes down under the Vev1, control goes to step 2 (step 102).

Figure 18C:
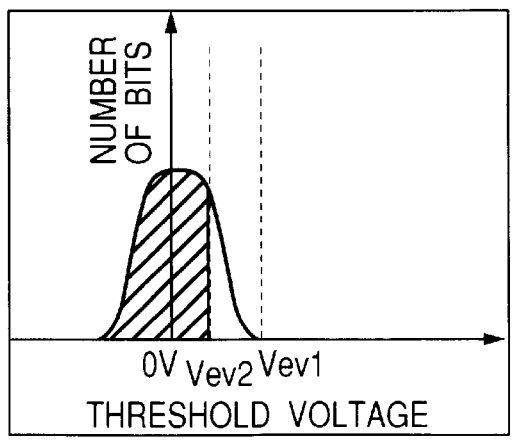

In step 2, it is checked whether or not the threshold voltage in every data-erased memory cell is lower than another predetermined voltage Vev2 (steps 103 and 104). When the threshold voltage in any memory cell is higher than the Vev2 as shown in FIG. 18C, data is written back only in the memory cell so that the threshold voltage in the memory cell goes higher than the Vev2 (step 105). At this time, just like in the first embodiment, writing is disabled in each memory cell in which the threshold voltage is higher than the Vev2.

Figure 18D:
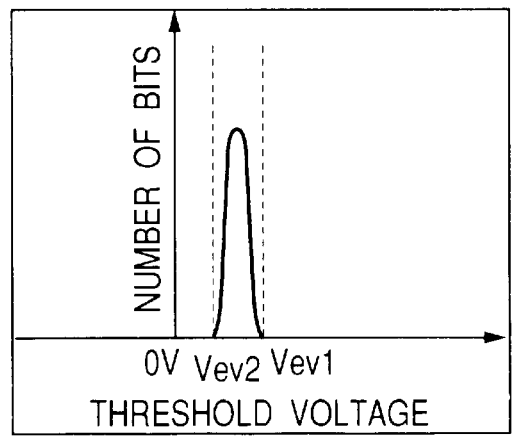

The write-back operation is ended (step 106) when the threshold voltage in each memory cell selected for write-back operation becomes higher than the predetermined voltage Vev2 as shown in FIG. 18D.

In this fourth embodiment, it is possible to write back data in the flash memory (EEPROM) when in a data erasing operation, thereby controlling so that the distribution range of threshold values becomes narrow after the data erasing. The fourth embodiment is thus effective for lowering the threshold voltage in each selected memory cell in the flash memory (EEPROM). In addition, just like in the first embodiment, this fourth embodiment is also effective to suppress or prevent erasure errors by suppressing the write-back disturbance that might occur in non-selected memory cells in the above writing-back.

Fifth Embodiment

In a flash memory (EEPROM), the distribution of threshold voltages in memory cells is divided (controlled in) into a plurality of storage levels, thereby one memory cell is enabled to store information of many bits. This method is referred to as a multiple-value storage method. In this embodiment, the present invention applies to an AND flash memory (EEPROM) enabled for such a multi-value storage. Hereunder, an example of such an AND flash memory (EEPROM) will be described with reference to FIGS. 19 to 21.

Figure 19A:
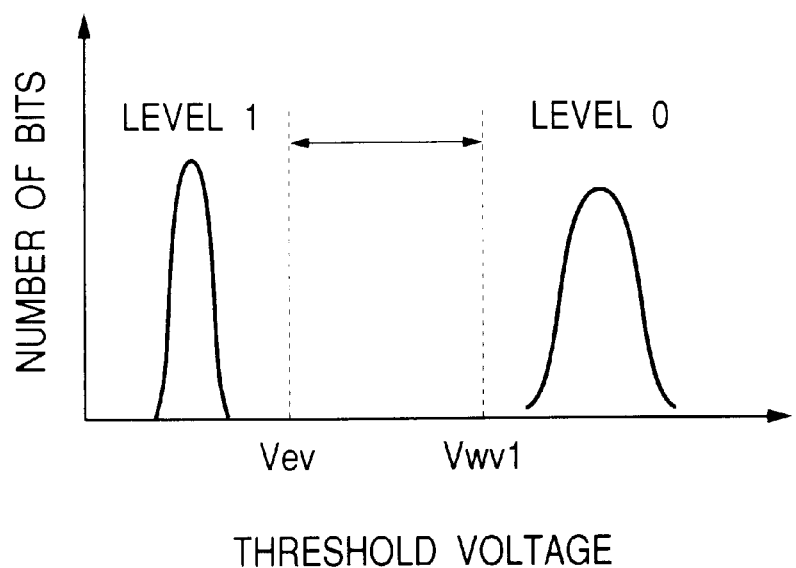
FIG. 19A is a chart for describing the distribution of threshold values in an ordinary binary memory and FIG. 19B is a chart for denoting the distribution of the threshold values in all the memory cells included in the flash memory (EEPROM) in another embodiment of the present invention.
Figure 19B:
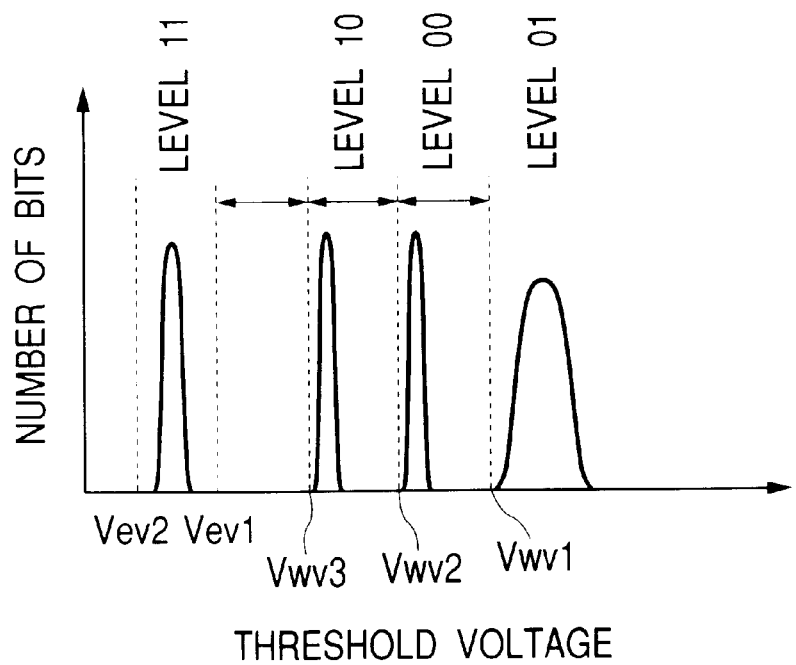

FIG. 19A shows a distribution of threshold values for an ordinary binary storage method and FIG. 19B shows a distribution of threshold values in all the memory cells included in the flash memory (EEPROM) in this embodiment.

In an ordinary flash memory (EEPROM), one memory cell stores one bit data (binary storage) as shown in FIG. 19A. On the contrary, in the flash memory (EEPROM) in this fifth embodiment, as shown in FIG. 19B, three types of verification voltages to be applied to a word line in a write operation, for example, Vwv1, Vwv2, and Vwv3 are set so that those voltages are changed over to divide a write operation into writing operations on three different levels. The three levels are combined with an erasure level so that the flash memory (EEPROM) in this embodiment enables a distribution of threshold voltages in memory cells to be controlled on four levels. In other words, one memory cell is enabled to store two-bit information (multiple-value storage). Consequently, the flash memory (EEPROM) is required of higher accuracy to control such threshold voltage distribution.

This is why the flash memory (EEPROM) in this embodiment is provided with means that reads two-bit information written in one memory cell by three read operations and cope with the three types of voltages to be applied to each selected word line when reading, then convert the read data to two-bit information and output it to external.

The storage levels, as well as types of verification voltages and read voltages are not limited only to those types. For example, it is also possible to control the distribution of threshold voltages in memory cells on eight levels so as to store four-bit information in one memory cell.

Figure 20:
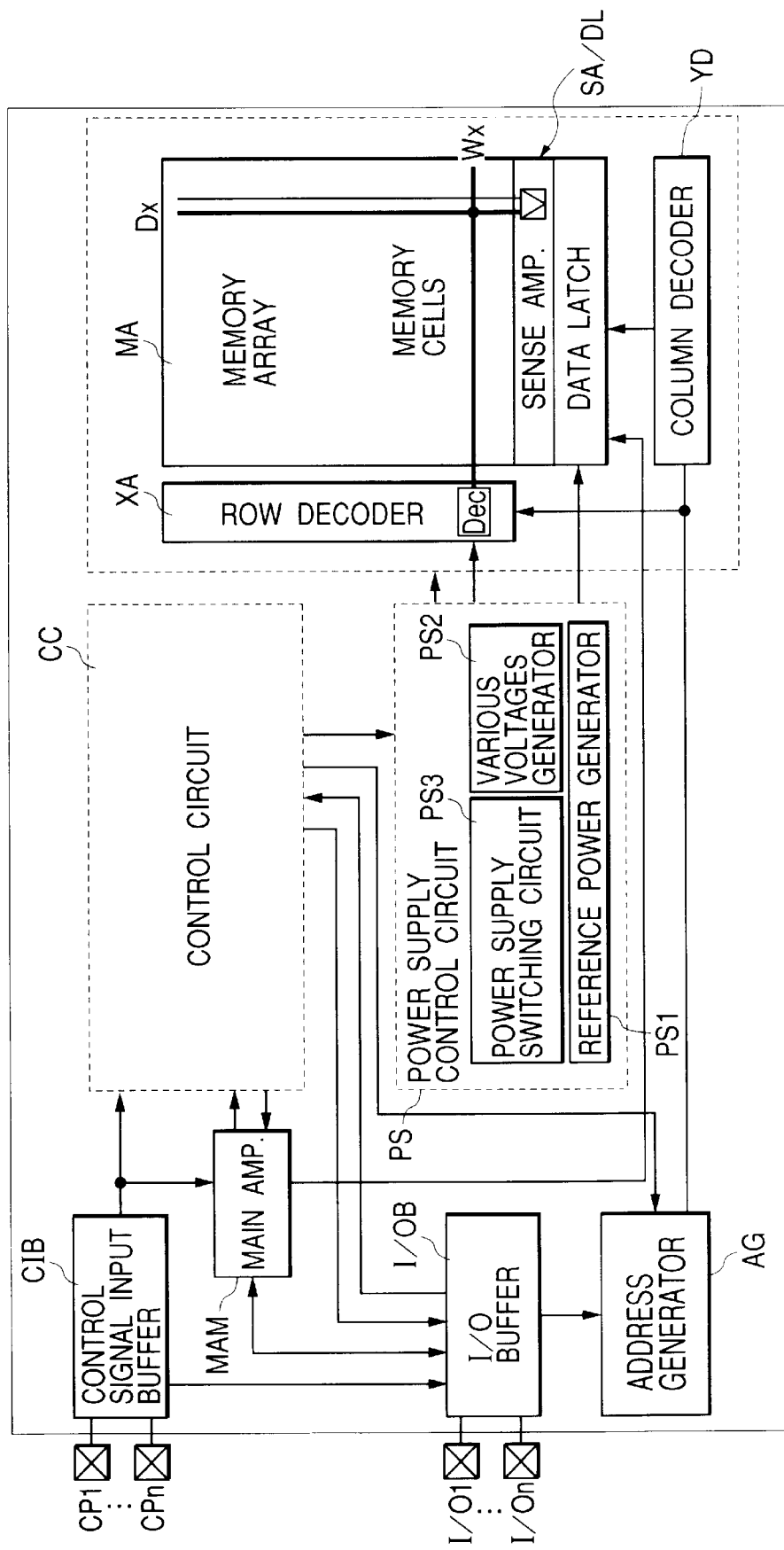
FIG. 20 is a circuit diagram of the major part of the flash memory (EEPROM) in another embodiment of the present invention.

FIG. 20 shows a block diagram of the circuitry of the flash memory (EEPROM) in this embodiment. This circuit includes a memory array MA as a basic element and a row decoder XD, a sense amplifier/data latching circuit SA/DL, and a column decoder YD as the directly connected peripheral circuits.

The memory array MA includes memory cells MC disposed in rows and columns just like in the configuration shown in FIG. 3, as well as word lines W1 to Wm, data lines D1 to Dn, a selective MIS, etc. connected to the memory cells MC.

The row decoder XD is to be connected to a selected word line (W1 to Wm) included in the memory array MA and the column decoder is to be connected to a selected data line (D1 to Dn) included in the memory array MA via the sense amplifier/data latching circuit SA/DL. A word line Wx denotes a selected predetermined word line. A main data line Dx denotes a selected predetermined data line.

The I/O terminals I/O1 to I/On are connected to the inputs of the I/O buffer I/OB. The I/O buffer I/OB is connected to the row decoder XD and the column decoder YD via the address generator AG. The I/O buffer I/OB is also connected to the data sense amplifier/data latching circuit SA/DL and the control circuit CC.

The control terminals CP1 to CPn are connected electrically to the control circuit CC and the main amplifier MAN via the control signal input buffer CIB. The main amplifier MAN is connected to the control circuit CC and the I/O buffer I/OB. The control circuit CC is connected to the row decoder XD and the sense amplifier/data latching circuit SA/DL via the power supply control circuit PS.

The power supply control circuit PS is provided with a reference power generator PSI, a various voltages generator PS2, and a power supply switching circuit PS3. The various voltages generator PS2 in this embodiment generates three types of write voltages and verification voltages respectively in each write operation to store two-bit information in one memory cell. In a read operation, the various voltages generator PS2 also generates three types of read voltages.

Next, an example of the operation method of this embodiment will be described.

Figure 21:
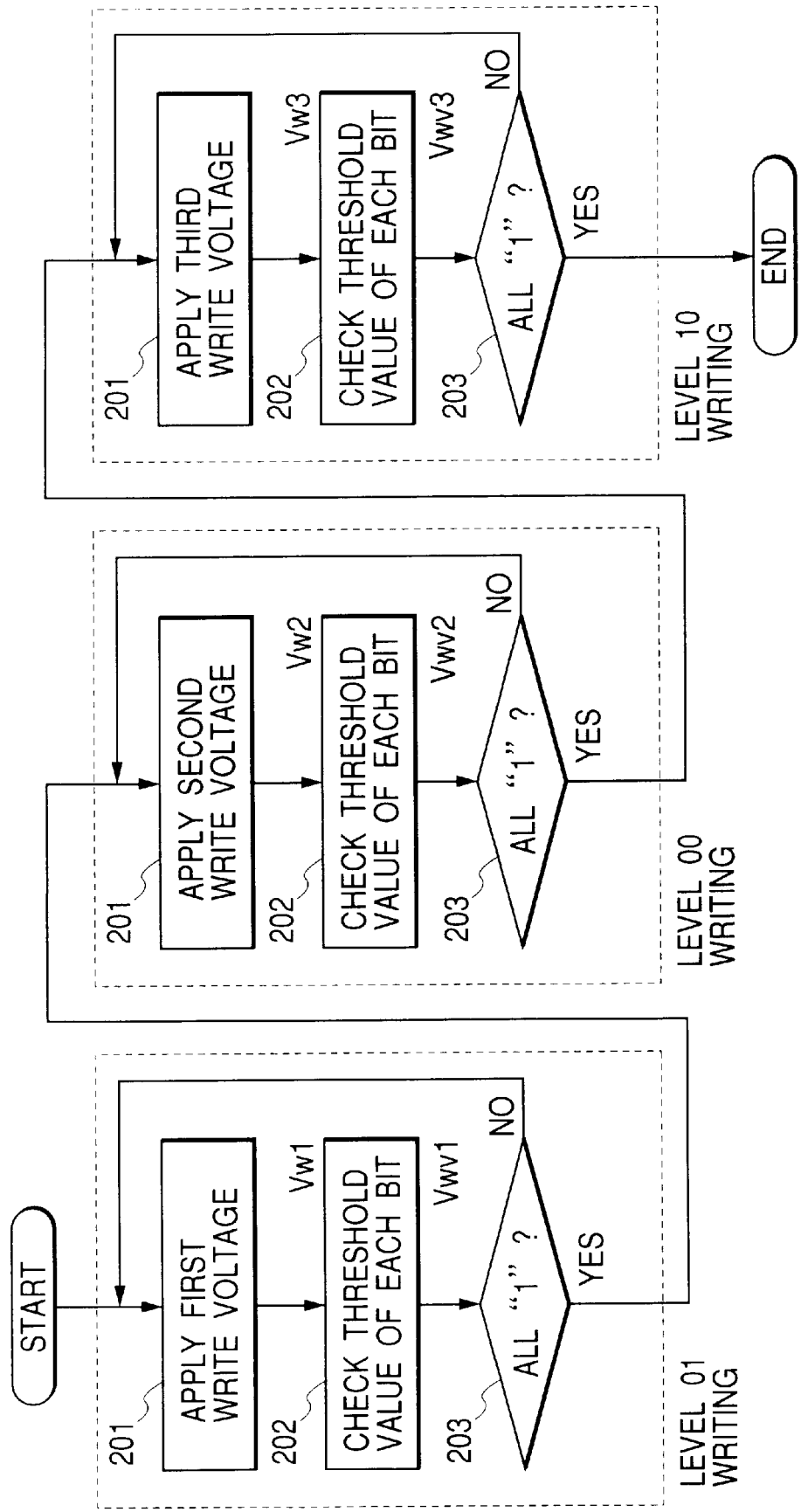
FIG. 21 is a flowchart of data writing in the flash memory (EEPROM) in another embodiment of the present invention.

FIG. 21 shows a flowchart of the write operation in the flash memory (EEPROM) in this embodiment. In the flash memory (EEPROM) in this embodiment, three different write voltages and three different verification voltages are used so that those voltages are changed over for writing on each level. For example, a series of writing operations are executed on each of levels '01', '00', and '10' (the processes in steps 201 to 203 are repeated with three different voltages applied to the selected word line)

Writing on each level is done as follows.

In FIG. 20, a WRITE command received via a control pin (CP1 to CPn) is transferred to the control circuit CC via the control signal input buffer CIB, then translated to a control signal in the control circuit CC. This control signal is then transferred to the power supply control circuit PS and used to control the power supply switching circuit PS3 to change the output of the various voltages generator PS2 to a predetermined write voltage Vw required for writing the target data. Consequently, the write voltage Vw is supplied to the row decoder XD.

On the other hand, a row address signal received from the I/O buffer I/OB is transferred to the row decoder XD via the address generator AG and decoded to a word line drive signal there. A predetermined word line Wx selected by this word line drive signal (the selected word line W1 in FIG. 3) is driven by a word driver or the like, thereby a write voltage Vw is applied to the control gate electrode of the selected memory cell MC via the word line Wx.

In the same way, the selected data line Dx is selected by a column address signal transferred to the column decoder YD from the I/O buffer I/OB via the address generator AG. In addition, a predetermined voltage is applied to the sense amplifier/data latching circuit SA/DL from the power supply control circuit PS according to a command received by the control circuit CC via the control signal input buffer CIB. Consequently, a voltage 0V is applied to the drain of the selected memory cell MC and a writing disable voltage Vwd (ex., 6V) is applied to the drain of each non-selected memory cell MC. The source of the memory cell MC is set in the floating state due to the source selecting MIS that is turned off and the p-well PWL (see FIG. 1, etc.) is driven to the ground potential.

The detailed timing flowchart of this writing is the same as that shown in FIG. 4 in the above embodiments. However, the Vw shown in FIG. 4 is varied properly according to each write level in this embodiment. For example, the Vw is set to the first write voltage Vw1 for writing on the level '01'. And, just like in the above embodiments, a writing disable voltage. Vwd is applied to each non-selected memory cell connected to the same word line as that of the selected memory cell.

As shown in FIG. 21, after the application of the first write voltage Vw1, it is checked (steps 201 and 202) whether or not the threshold voltage in the selected memory cell is higher than the verification voltage Vwv1 (step 203). When the check result is NO, control goes back to repeat the first write voltage application and the verification. In this case, upon the application of the second write voltage Vw1, the same writing disable voltage Vwd as that of the non-selected memory cells is applied to the memory cell in which the threshold voltage rises higher than the verification voltage Vwv1 after the application of the first write voltage Vw1, that is, each memory cell in which the writing is already completed at the first writing. When the threshold voltage in every selected memory cell rises higher than the verification voltage Vwv1 after such processing, the writing on level '01' is completed, then control goes to the next writing on level '00'. Hereinafter, the processes are repeated until the writing is completed just like those described above.

In this embodiment, a description has been made for writing data in an AND flash memory (EEPROM) dividedly on a plurality of levels. In an AND flash memory in which memory cells are connected to sub-bit lines in parallel, however, if the threshold voltage in any one of the memory cells goes under 0V, the whole AND unit is kept on whether the memory cell is selected or not selected, thereby data cannot be read normally from the AND unit. In order to prevent such trouble, therefore, the lower limit of the threshold voltage distribution must be set to a value slightly higher than 0V. On the other hand, when an excessively high read voltage is set, problems arise: for example, much time is needed to raise the read voltage and the read disturbance as described above develops. In order to prevent such problems, therefore, the upper limit of the threshold voltage distribution must be set at 5V or so. Consequently, when the multiple-value storage method is employed for an AND flash memory (EEPROM), it is required that a plurality of threshold voltage distributions should be prepared in a limited voltage range and such threshold voltage distributions should be controlled more accurately in writing than when single-bit data is stored in one memory cell as shown in FIG. 19A.

This fifth embodiment is intended to suppress or prevent the write disturbance that might occur in non-selected memory cells when in writing as described above and accordingly, the fifth embodiment is especially suitable for multiple-value storage in which threshold voltages must be controlled accurately. And, for such a multiple-value storage, it is required to apply a writing disable voltage also in each selected memory cell so as to narrow the range of the threshold voltage distribution after the selected memory cell reaches a predetermined verification voltage. Therefore, write disturbance comes to occur in more memory cells than the binary storage. This is why the technique in this embodiment is more effective to solve the above conventional problems and achieve the object of the present invention.

Next, a description will be made for how data is erased from memory cells in the flash memory (EEPROM) in this embodiment.

The detailed timing flowchart of data erasing is the same as that in any of the above embodiments. As described in the fourth embodiment, data erasing is done in two steps, thereby realizing a narrow range distribution of threshold voltages appropriately to multiple-value storage.

In step 1, an erase command received from a control pin (PC1 to PCn) shown in FIG. 20 is transferred to the control circuit CC via the control signal input buffer CIB, then translated to a control signal there. This control signal is then transferred to the power supply control circuit PS and used to control the power supply switching circuit PS3 to change the output of the various voltages generator PS2 to a predetermined erase voltage Vew required for erasing target data. Consequently, the erase voltage Vew is supplied to the row decoder XD.

On the other hand, a row address signal received from the I/O buffer I/OB is transferred to the row decoder via the address generator AG and decoded to a word line drive signal there. A predetermined word line Wx selected by this word line drive signal (the selected word line W1 in FIG. 3) is driven by a word driver or the like, thereby an erase voltage Vew is applied to the control gate electrode of the selected memory cell MC via the word line Wx.

The source of the memory cell MC is set in the floating state due to the source selecting MIS that is turned off. Both of the drain and the p-well PWL (see FIG. 1, etc.) are driven to the ground potential.

After this, the above processes are repeated until the threshold voltage in every selected memory cell connected to the selected word line goes lower than a predetermined reference voltage Vev1. Control then goes to step 2.

In step 2, data is written back only in the erased memory cells selectively in which the threshold voltage is lower than the predetermined reference voltage Vev2 respectively. At this time, how a write-back disable voltage Vwd is applied to non-selected write-back memory cells is the same as that in the fourth embodiment.

When the threshold voltage in every selected memory cell goes over the verification voltage Vev2 in this way, the erase operation is completed.

The effects of this embodiment in such data erasing are the same as any of those in the data writing described above.

Sixth Embodiment

In this sixth embodiment, an integrated circuit card provided in a flash memory (EEPROM) will be described.

Figure 22:
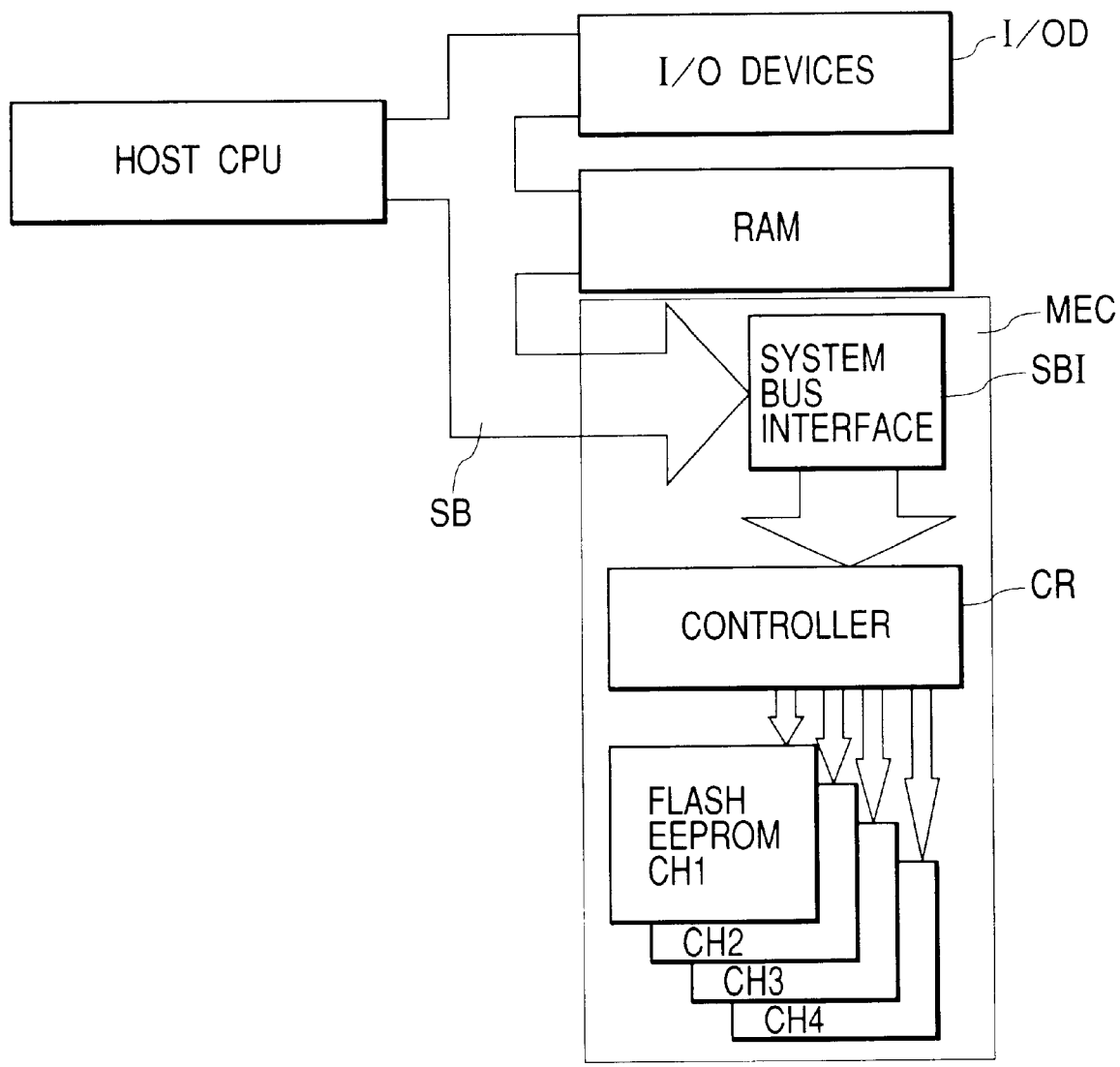
FIG. 22 is an apparatus provided with an integrated circuit card, which is still another embodiment of the present invention.

FIG. 22 shows a computer system in this sixth embodiment. This computer system is provided with a host CPU connected via a system bus SB, as well as an I/O device I/OD, a RAM, and a memory card (integrated circuit card) MEC.

The memory card MEC includes a large capacity memory circuit replaceable with a hard disk unit. The capacity is, for example, several tens of giga bytes. The memory card MEC includes a plurality of chips CH1 to CH4 in each of which a system bus interface SBI, a controller CNT, and the flash memory (EEPROM) employed in the above embodiments are formed.

The memory card MEC, therefore, can further improve the effects of the flash memory (EEPROM) described above, that is, the data rewriting frequency and data retention properties obtained by suppressing the write disturbance phenomenon that might occur in write-disabled memory cells. The memory card MEC can thus have industrial advantages to be used satisfactorily as a storage unit.

Needless to say, the present invention in this embodiment is not limited only to thin memory cards. The present invention in this embodiment may also apply to any non-volatile storage unit (semiconductor device) that includes an intelligent controller that can control flash memories (EEPROM) by analyzing the interface with the host system and the host system commands even when they are thick.

This memory card MEC stores data to be held for a long time. On the other hand, the non-volatile RAM stores data processed by the host CPU and to be updated frequency. The memory card MEC is provided with a system bus interface SBI connected to the system bus SB, thereby the memory card MEC can interface with such standard buses as, for example, an ATA system bus, etc. The controller CR connected to the system bus interface SBI receives commands and data from the host CPU connected to the system bus SB and the host system of the I/O device I/OD.

For a READ command, the controller accesses one or more necessary flash memories (EEPROM) to read data, then transfers the data to the host system.

For a WRITE command, the controller CR accesses one or more necessary chips CH1 to CH4 (flash memories (EEPROM) ) to store data written from the host system in itself. This storing operation includes execution of programs and verification of data for blocks, sectors, and memory cells in each flash memory (EEPROM).

For an ERASE command, the controller CR accesses one or more necessary chips CH1 to CH4 (flash memories (EEPROM)) to erase data therefrom. This erasing operation includes erasing from and verifying of data in blocks, sectors, and memory cells in each flash memory (EEPROM).

The memory card MEC in this embodiment can prevent data errors that might occur in blocks, sectors, or memory cells in which no data is written when in storing written data in a plurality of chips CH1 to CH4 (flash memories (EEPROM) according to the above WRITE command. Consequently, the memory card MEC can reduce or prevent troubles using the computer system; one of the problems is, for example, a case in which written data therein is updated without the user's knowledge while data processing is done repetitively.

The configuration of the memory card MEC in this embodiment can be modified, for example, so as to be used as a hard disk unit as described above. For example, it may be used to store data related to music and photos, as well as data related to financial transactions, distribution, medicine, insurance, traffic, transportation, or public telephone. When the memory card MEC in this embodiment is used to store music and image data, it is possible to suppress or prevent partial changes of desired music and image data without user's knowledge. In addition, when the memory card MEC is used to store. financial and distribution data, it is possible to suppress or prevent trouble that, for example, a sum of money stored in the MEC is reduced from the expected one. When the memory card MEC is used to store medical and insurance data, for example, as an electronic clinical record card or health insurance card, it is possible to suppress or prevent, for example, trouble that written personal information is changed wrongly without the user's notice. Furthermore, when the memory card MEC is used to store traffic and transportation data, for example, used to buy a passenger ticket, toll highway ticket, or seat reservation card for a train, it is possible to suppress or prevent, for example, trouble that a desired usable fee and/or seat reservation data is changed without the user's notice.

While the preferred form of the present invention has been described, it is to be understood that modifications will be apparent to those skilled in the art without departing from the spirit of the present invention.

For example, ACEE (Array Contactless EEprom) cells may be used as memory cells of any flash memory (EEPROM) described above. This type cells are composed on the basis of FLOTOX (FLOating-gate Tunnel-Oxide) cells and each of those cells has a tunnel insulator layer formed only in its source forming semiconductor region and makes the most use of the FN tunneling phenomenon for writing/erasing data therein/therefrom.

Although the memory card in the above sixth embodiment is provided with a controller as well as the semiconductor chips used as flash memories (EEPROM) formed therein, the present invention may also apply to any memory card in which only a plurality of semiconductor chips used as flash memories (EEPROM) are formed therein.

Although the description has been made mainly for a single unit flash memory (EEPROM) to which the present invention has applied, the present invention may also apply to any semiconductor device in which such a logical circuit to, as, for example, a microprocessor and a flash memory (EEPROM) are mounted together.

According to the representative one of the present inventions disclosed in this specification, the following effects are obtained.

It is possible to provide a semiconductor device provided with non-volatile memory cells, in any selected one of which data can be written electrically by means of the so-called tunneling phenomenon. The semiconductor can suppress or prevent the so-called write disturbance phenomenon that might occur in write-disabled memory cells by generating a punch-through phenomenon between the source and the drain of each non-selected memory cell, thereby raising the source potential of the non-selected memory cell before a writing disable voltage is applied to the non-selected memory cell.

What is claimed is:

1. A semiconductor device, comprising:
a plurality of non-volatile memory cells, each including a holding layer, in each of which data can be written electrically with electrons injected in its holding layer;
wherein said device is structured so as to generate a punch-through phenomenon between a source and a drain of a non-selected memory cell included among said plurality of non-volatile memory cells when a writing disable voltage is applied to said drain thereof, which said non-selected memory cell is disabled to be written with data.

2. A semiconductor device, comprising:
a plurality of non-volatile memory cells arranged in rows and columns, each of which includes source and drain regions formed over a semiconductor substrate, a holding layer formed between said source and drain regions via a gate insulator, and a control gate electrode formed over said holding layer via an insulator, each of said plurality of non-volatile memory cells enabling data to be written therein electrically with electrons injected in its holding layer;

a word line connected to said control gate electrodes of a plurality of memory cells included among said plurality of memory cells and disposed in the same row;

a data line connected to said drain regions of a plurality of memory cells included among said plurality of memory cells and disposed in the same column; and a source line connected to said source regions of a plurality of memory cells included among said plurality of memory cells and disposed in the same column;

wherein said device employs:

a writing method for writing data in a memory cell selected from said plurality of memory cells with electrons injected in its holding layer with a high write voltage applied to a selected word line connected to said selected memory cell;

a write disabling method for disabling writing of data in a non-selected memory cell in which no data is to be written and having a control gate electrode connected electrically to said selected word line with a writing disable voltage applied to a data line connected to said drain region of said non-selected memory cell before application of said high write voltage to said selected word line; and wherein said device is structured so as to generate a punch-Through phenomenon between said source and drain regions of said non-selected memory cell when said writing disable voltage is applied to said drain region of said non-selected memory cell.

3. A semiconductor device, comprising:

a plurality of non-volatile memory cells, each including a holding layer, in each of which data can be written electrically with electrons injected in its holding layer:

wherein said device employs:

a write disabling method for disabling writing of data in a non-selected memory cell in which no data is to be written by suppressing injection of electrons in its holding layer with a writing disable voltage applied to the drain thereof before a write voltage is applied to the control gate electrode of a selected memory cell in which data is to be written, said non-selected memory cell being included among said plurality of memory cells; and wherein the relationship among said writing disable voltage Vwd, a read voltage yr applied to said drain of a memory cell from which said data is to be read, and a punch-through withstand voltage BVds between the source and drain of each of said plurality of memory cells is set so as to satisfy Vr<BVds<Vwd.

4. A semiconductor device, comprising:

a plurality of non-volat)le memory cells arranged in rows and columns, each of which includes source and drain regions formed over a semiconductor substrate, a holding layer formed between said source and drain regions via a gate insulator, and a control gate electrode formed over said holding layer via an insulator, each of said plurality of memory cells enabling data to be written therein electrically with electrons injected in its holding layer;

a word tine connected to said control gate electrodes of a plurality of memory cells included among said plurality of memory cells and disposed in the same row;

a data line connected to said drain regions of a plurality of memory cells included among said plurality of memory cells and disposed in the same column; and a source line connected to said source regions of a plurality of memory cells included among said plurality of memory cells and disposed in the same column;

wherein said device employs:

a writing method for writing data ri a memory cell selected from said plurality of memory cells with electrons injected in its holding layer with a high write voltage applied to a selected word line connected to said selected memory cell;

a write disabling method for disabling writing of data in a non-selected memory cell in which no data is to be written and having a control gate electrode connected electrically to said selected word line with a writing disable voltage applied to a data line connected to said drain region of said non-selected memory cell before application of said high write voltage to said selected word line: and wherein the relationship among said writing disable voltage Vwd, a read voltage yr applied to said drain region of a memory cell from which said data is to be read, and a punch-through withstand voltage BVds between said source and drain regions of each of said plurality of memory cells is set so as to satisfy Vr<BVds<Vwd.

5. A semiconductor device, comprising:

a plurality of non-volatile memory cells, each of which includes second conductivity type source and drain regions formed in a first conductivity type semiconductor region so as to oppose each other at a fixed interval therebetween, a holding layer and a gate electrode stacked in said first conductivity type semiconductor region between said source and drain regions, the non-volatile memory being capable of rewriting;

a memory array comprised of a plurality of memory cells arrayed in rows and columns so that the gate electrodes of a plurality of memory cells disposed in the same row are connected to a word line and said drain region of a plurality of memory cells disposed in the same column are connected to a data line via a first selected transistor. and said source region of a plurality of memory cells disposed in the same column are connected to a common source line via a second selected transistor;

wherein said device employs:

an operating method for writing data in a memory cell selected from among said plurality of memory cells with electrons injected in its holding layer with a high write voltage applied to a selected word line connected to said selected memory cell when in a process of writing data; and disabling writing of data in a non-selected memory cell in which no data is to be written and being disposed in the same row as that of said selected memory cell by suppressing injection of electrons in its accumulation layer with a writing disable voltage applied to a data line connected to said non-selected memory cell before application of a high write voltage to said selected word line; and wherein the relationship among said writing disable voltage Vwd, a read voltage Yr applied to said data line from which said data is to be read, and a punch- through withstand voltage BVds between said source and drain regions of each of said plurality of memory cells is set so as to satisfy Vr<BVds<Vwd.

6. The semiconductor device according to claim 3, 4 or 5 wherein the relationship between said writing disable voltage Vwd and a breakdown voltage BVdj of a junction between said drain region of each of said plurality of memory cells and said semiconductor substrate is set to satisfy Vwd<BVdj.

7. The semiconductor device according to any of claims 1 to 5; wherein a potential of a non-selected word line is set to a predetermined value before a writing disable voltage is applied to a data line connected to said non-selected memory cell.

8. A semiconductor device, comprising:

a plurality of non-volatile memory cells, in/from each of which data can be written/erased electrically with electrons injected/ejected in/from its holding layer;

wherein said device is structured so as to generate a punch-through phenomenon between source and drain regions of appropriately erased memory cells which is applied with a write-back disable voltage to its drain region, prior to said writing back procedure for memory cells from which data is erased excessively after erasing data from said plurality of non-volatile memory cells.

9. A semiconductor device, comprising:

a plurality of non-volatile memory cells arranged in rows and columns each of which includes source and drain regions formed on a semiconductor substrate, a holding layer formed between said source and drain regions via a gate insulator, and a control gate electrode formed on said holding layer via an insulator, said memory cell enabling data to be written/erased therein/therefrom electrically with electrons injected/ejected in/from said holding layer;

a word line connected to said control gates of a plurality of non-volatile memory cells included among said plurality of memory cells and disposed in the same row;

a data line connected to said drain regions of a plurality of memory cells included among said plurality of memory cells and disposed in the same column; and a source line connected to said source regions of a plurality of memory cells included among said plurality of memory cells and disposed in the same column wherein said device employs:

a first erasing method for erasing data from all said memory cells connected to a selected word line by ejecting electrons from their accumulation layers with a high erase voltage applied to said selected word line until the threshold voltages in all of said memory cells go down to the first voltage or lower when erasing data;

a second erasing method for writing back data in a memory cell whose threshold voltage is the second voltage or lower with electrons injected in its holding layer with a write-back voltage applied to a word line connected to said memory cell until said threshold voltage goes up to said second voltage or higher; then disabling writing-back of data in a memory cell disposed in the same row as that of said memory cell in which data is written back and having a threshold voltage of said second voltage or higher by suppressing injection of electrons in its holding layer with a write-back disable voltage applied to said drain region of said disabled memory cell before application of said write-back voltage;

and wherein said device is structured so as to generate a punch-through phenomenon between said source and drain regions of said memory cell in which no data is written back upon application of a write-back disable voltage to said drain region of said memory cell in which data is erased and no data is to be written back when in a process of said writing-back of data.

10. A semiconductor device, comprising: a plurality of non-volatile memory cells, each including a holding layer, in/from each of which data can be written/erased electrically with electrons injected/ejected in/from its holding layer;

wherein said device employs:

a first erasing method for erasing data from all the memory cells connected to a selected word line by ejecting electrons from their holding layers with a high erase voltage applied to said word line until the threshold voltages in all of said memory cells go down to the first voltage or lower when erasing data;

a second erasing method for writing back data in a memory cell whose threshold voltage is the second voltage or lower with electrons injected in its holding layer with a write-back voltage applied to a word line connected to said memory cell until said threshold voltage goes up to said second voltage or higher; then disabling writing-back of data in a memory cell disposed in the same row as that of said memory cell in which data is to be written back and having a threshold voltage of said second voltage or higher by suppressing injection of electrons in its holding layer with a write-back voltage applied to said drain region of said disabled memory cell before application of said write-back voltage; and wherein the relationship among said write-back disable voltage Vwd, a read voltage yr applied to the drain of a memory cell from which said data is to be read, and a punch-through withstand voltage BVds between the source and the drain of each of said plurality of memory cells is set to satisfy Vr<BVds<Vwd.

11. A semiconductor device, comprising:

a plurality of non-volatile memory cells, each of which includes second conductivity type source and drain regions formed in a first conductivity type semiconductor region so as to oppose each other at a fixed interval therebetween, a holding layer and a gate electrode laminated in said first conductivity type semiconductor region between said first conductivity type source and drain regions, the non-volatile memory cell being capable of rewriting:

a memory array comprised of a plurality of memory cells arrayed in rows and columns so that the gate electrodes of a plurality of memory cells disposed in the same row are connected to a word line and said drain regions of a plurality of memory cells disposed in the same column are connected to a data line via a first selection transistor and said source regions of a plurality of memory cells disposed in the same column are connected to a common source line via a second selection transistor;

wherein said device employs:

a first erasing method for erasing data from all the memory cells connected to a selected word line by ejecting electrons from their accumulation layers with a high erase voltage applied to said selected word line until the threshold voltages in all said memory cells go down to the first voltage or lower;

a second erasing method for writing back data in a memory cell whose threshold voltage is the second voltage or lower with electrons injected in its holding layer with a write-back voltage applied to a word line connected to said memory cell until said threshold voltage goes up to said second voltage or higher; then disabling writing-back of data in a memory cell disposed in the same row as that of said memory cell in which data is to be written back and having a threshold voltage of said second voltage or higher by suppressing injection of electrons in its accumulation layer with a write-back disable voltage applied to the drain forming semiconductor region of said memory cell before application of said write-back voltage; and wherein the relationship among said write-back disable voltage Vwd, a read voltage Yr applied to said data line from which said data is to be read; and a punch-through withstand voltage BVds between said source and drain regions of said memory cell is set to satisfy Vr<BVds<Vwd.

12. The semiconductor device according to claim 10 or 11 wherein the relationship between said write-back disable voltage Vwd and said breakdown voltage BVdj of said junction between the drain of each of said plurality of memory cells and said semiconductor substrate is set to satisfy Vwd<BVdj.

13. The semiconductor device according to any of claims 8 to 11, wherein a potential of a non-selected word line is set to a predetermined value before a write-back disable voltage is applied to a data line connected to a memory cell in which no data is written back in said write-back operation.

14. The semiconductor device according to any of claims 1 to 5 and 8 to 11;

wherein an AND unit is formed with a predetermined number of memory cells included among said plurality of memory cells and connected to each other in parallel between a pair of a sub-data line and a sub-source line therein;

wherein a first selection transistor is disposed at one end of said AND unit so as to connect said sub-data line with data line selectively; and wherein a second selection transistor is disposed at another end of said AND unit so as to connect said sub-source line with source line selectively.

15. The semiconductor device according to claim 14;

wherein a short-circuiting transistor for short-circuiting-circuiting between said sub-data line and said sub-source line is connected to each of said plurality of memory cells in parallel in each AND unit.

16. The semiconductor device according to any of claims 1 to 5 and 8 to 11;

wherein a NAND unit is formed with a predetermined number of memory cells included among said plurality of memory cells and disposed in the same column and connected serially to each other;

wherein one end of said NAND unit is connected to a data line via said first selection transistor; and wherein another end of said NAND unit is connected selectively to a source line via said second selection transistor.

17. The semiconductor device according to any of claims 1 to 2 and 8 to 11;

wherein said holding layer is a floating gate electrode formed with a conductor enclosed by an insulator.

18. The semiconductor device according to any of claim 1 to 5 and 8 to 11;

wherein said device further includes means for enabling two or more bits of data to be stored in each of said plurality of memory cells.

19. An integrated circuit card provided with a plurality of semiconductor chips for forming a memory circuit block whose total capacity satisfies a predetermined requirement as a whole;

wherein each of said plurality of semiconductor chips has a plurality of non- volatile memory cells, each including a holding layer, in each of which data can be written electrically with electrons injected in its holding layer: and wherein said card is structured so as to generate a punch-through phenomenon between said source and drain regions of a non-selected memory cell in which no data is to be written upon application of a writing disable voltage to said drain of said non- selected memory cell, said non-selected memory cell being included among said plurality of memory cells.

20. An integrated circuit card provided with a plurality of semiconductor chips used to form a memory circuit block whose capacity satisfies a predetermined requirement as a whole;

wherein each of said plurality of semiconductor chips includes:

a plurality of non-volatile memory cells arranged in rows and columns, each of which includes source and drain regions formed on a semiconductor substrate of said semiconductor chip, a holding layer formed between said source and drain regions via a gate insulator, and a control gate electrode formed on said holding layer via an insulator, each of said memory cells enabling data to be written therein electrically with electrons injected in its holding layer;

a word line connected to the control gate electrodes of a plurality of memory cells included among said plurality of memory cells and disposed in the same row;

a data line connected to said drain regions of a plurality of memory cells included among said plurality of memory cells and disposed in the same column; and a source line connected to said source regions of a plurality of memory cells included among said plurality of memory cells and disposed in the same column;

wherein said card employs:

a writing method for writing data in a memory cell selected from said plurality of memory cells with electrons injected in its holding layer with a write voltage applied to a selected word line connected to said selected memory cell; and a write disabling method for disabling writing of data in a non-selected memory in which no data is to be written and having a control gate electrode connected electrically to said selected word like by suppressing injection of electrons in its holding layer with a writing disable voltage applied to a data line connected to said drain region of said non-selected memory cell before application of said high write voltage to said selected word line; and wherein the relationship among said writing disable voltage Vwd, a read voltage Vr applied to said drain region of said memory cell from which said data is to be read, and a punch-through withstand voltage BVds between said source and drain regions of each of said plurality of memory cells is set to satisfy Vr<BVds<Vwd.

21. An integrated circuit card provided with a plurality of semiconductor chips for forming a memory card block having a predetermined capacity as a whole;

wherein each of said plurality of semiconductor chips includes:

a plurality of non-volatile memory cells, each including a holding layer, in/from each of which data can be written/erased electrically with electrons injected/ejected in/from its holding layer;

wherein said card employs:

a first erasing method for erasing data from all the memory cells connected to a selected word line by ejecting electrons from their holding layers with a high erase voltage applied to said selected word line until the threshold voltages in all of memory cells go down to the first voltage or lower when erasing data; and a second erasing method for writing back data in a memory cell whose threshold voltage is the second voltage or lower with electrons injected in its holding layer with a write-back voltage applied to a word line connected to said memory cell until said threshold voltage goes up to said second voltage or higher; then disabling writing-back of data in a memory cell disposed in the same row as that of said memory cell in which data is to be written back and having a threshold voltage of the second voltage or higher by suppressing injection of electrons in its accumulation layer with a write-back voltage applied to said drain region of said disabled memory cell before application of said write-back voltage; and wherein the relationship among said write-back disable voltage Vwd, a read voltage Yr applied to said drain region of a memory cell from which said data is to be read, and a punch-through withstand voltage BVds between said source and drain regions of each of said plurality of memory cells is set to satisfy Vr<BVds<Vwd.

22. A semiconductor device, comprising:

a plurality of non-volatile memory cells including a source region, a drain region, a control gate and a holding layer in each of which data can be written electrically;

wherein, at a timing of data writing for said a plurality of non-volatile memory cells with electrons injected in said holding layers, writing non-selected memory cells of said a plurality of non-volatile memory cells are applied with voltages in steps of:

(a) a writing disable voltage applied to a data line connected to a drain region of said writing non-selected memory cells, which said writing disable voltage is lamer than a punch-through withstand voltage between a source and drain regions of each of said plurality of non-volatile memory cells, (b) after the step (a), a first high write voltage applied to a selected word line connected to a control gate of said writing non-selected memory cells, which said first high write voltage is larger than said writing disable voltage, and (c) after the step (b), a second high write voltage applied to a selected word line connected to a control gate of said writing non-selected memory cells, which said second high write voltage is larger than said first high write voltage.

23. The semiconductor device according to claim 22;

wherein an AND unit is formed with a predetermined number of memory cells included among said plurality of memory cells and connected to each other in parallel between a pair of a sub-data line and a sub-source line therein.

24. The semiconductor device according to claim 22;

wherein a NAND unit is formed with a predetermined number of memory cells included among said plurality of memory cells and disposed in the same column and connected serially to each other.

25. The semiconductor device according to claim 22;

wherein said device further includes means for enabling two or more bits of data to be stored in each of said plurality of non-volatile memory cells.

26. The semiconductor device according to claim 22;

wherein said holding layer comprising a polysilicon layer.

27. The semiconductor device according to any of claims 1 to 5 and 8 to 11;

wherein, in said plurality of non-volatile memory cells, data can be written electrically with electrons injected in its holding layer through a tunneling phenomenon.

* * * * *